US010096451B2

(12) United States Patent
Namai et al.

(10) Patent No.: US 10,096,451 B2
(45) Date of Patent: Oct. 9, 2018

(54) PATTERN MEASUREMENT DEVICE AND COMPUTER PROGRAM

(71) Applicant: Hitachi High-Technologies Corporation, Minato-ku, Tokyo (JP)

(72) Inventors: Hitoshi Namai, Tokyo (JP); Tomoaki Yamazaki, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 15/100,518

(22) PCT Filed: Dec. 1, 2014

(86) PCT No.: PCT/JP2014/081802
§ 371 (c)(1),
(2) Date: May 31, 2016

(87) PCT Pub. No.: WO2015/083675
PCT Pub. Date: Jun. 11, 2015

(65) Prior Publication Data
US 2016/0307730 A1 Oct. 20, 2016

(30) Foreign Application Priority Data
Dec. 5, 2013 (JP) ................... 2013-251611

(51) Int. Cl.
H01J 37/28 (2006.01)
G01B 15/00 (2006.01)
(52) U.S. Cl.
CPC ............ H01J 37/28 (2013.01); G01B 15/00 (2013.01); H01J 2237/24578 (2013.01); H01J 2237/2817 (2013.01)
(58) Field of Classification Search
CPC ............ H01J 37/28; H01J 2237/2817; H01J 2237/24592; G01B 15/00; G01B 2210/56
See application file for complete search history.

(56) References Cited

U.S. PATENT DOCUMENTS 5,287,275 A * 2/1994 Kimura .................. G06K 9/685
8,538,130 B2 9/2013 Ivanchenko et al.
(Continued)

FOREIGN PATENT DOCUMENTS

JP 2010-249587 A 11/2010
JP 2011-133378 A 7/2011
(Continued)

OTHER PUBLICATIONS

International Search Report (PCT/ISA/210) issued in PCT Application No. PCT/JP2014/081802 dated Feb. 24, 2015 with English-language translation (four (4) pages).
(Continued)

Primary Examiner — Wyatt Stoffa
(74) Attorney, Agent, or Firm — Crowell & Moring LLP

(57) ABSTRACT

The present invention is: a pattern measurement device that, regardless of increased fineness, deviation, or the like of a pattern, accurately and stably performs measurement on the basis of edge identification or pattern or edge judgment; and a computer program. The pattern measurement device classifies pattern sites (G1, G2, G3, G4), which are repeatedly arrayed at a specific interval, in accordance with the position of the pattern sites, and executes a pattern edge type identification, a pattern type identification, or a measurement of the dimensions between predetermined pattern sites on the basis of an association between the classified pattern sites and information pertaining to the pattern edge type or information pertaining to the pattern type. The computer program causes a computer to execute the abovementioned process.

15 Claims, 26 Drawing Sheets

(56) References Cited

U.S. PATENT DOCUMENTS

| | | | | |
|---|---|---|---|---|
| 9,000,365 B2* | 4/2015 | Mochizuki | ............ | G01B 15/00 |
| | | | | 250/306 |
| 9,024,272 B2* | 5/2015 | Sakai | ................. | G03F 7/70466 |
| | | | | 250/306 |
| 9,786,468 B2* | 10/2017 | Yokosuka | ............. | H01J 37/147 |
| 2010/0128966 A1* | 5/2010 | Abe | ....................... | G06K 9/342 |
| | | | | 382/141 |
| 2012/0037801 A1* | 2/2012 | Mochizuki | ............. | G01B 15/00 |
| | | | | 250/306 |
| 2012/0076393 A1* | 3/2012 | Ivanchenko | ........ | G03F 7/70466 |
| | | | | 382/145 |
| 2012/0267528 A1* | 10/2012 | Sakai | ................. | G03F 7/70466 |
| | | | | 250/307 |
| 2013/0270436 A1* | 10/2013 | Namai | .................... | H01J 37/28 |
| | | | | 250/307 |
| 2014/0320627 A1* | 10/2014 | Miyamoto | .......... | G03F 7/70633 |
| | | | | 348/80 |
| 2016/0320182 A1* | 11/2016 | Yamaguchi | ............ | G01B 15/00 |

FOREIGN PATENT DOCUMENTS

| | | |
|---|---|---|
| JP | 2012-519391 A | 8/2012 |
| WO | WO 2012/056639 A1 | 5/2012 |

OTHER PUBLICATIONS

Japanese-language Written Opinion (PCT/ISA/237) issued in PCT Application No. PCT/JP2014/081802 dated Feb. 24, 2015 (three (3) pages).

* cited by examiner

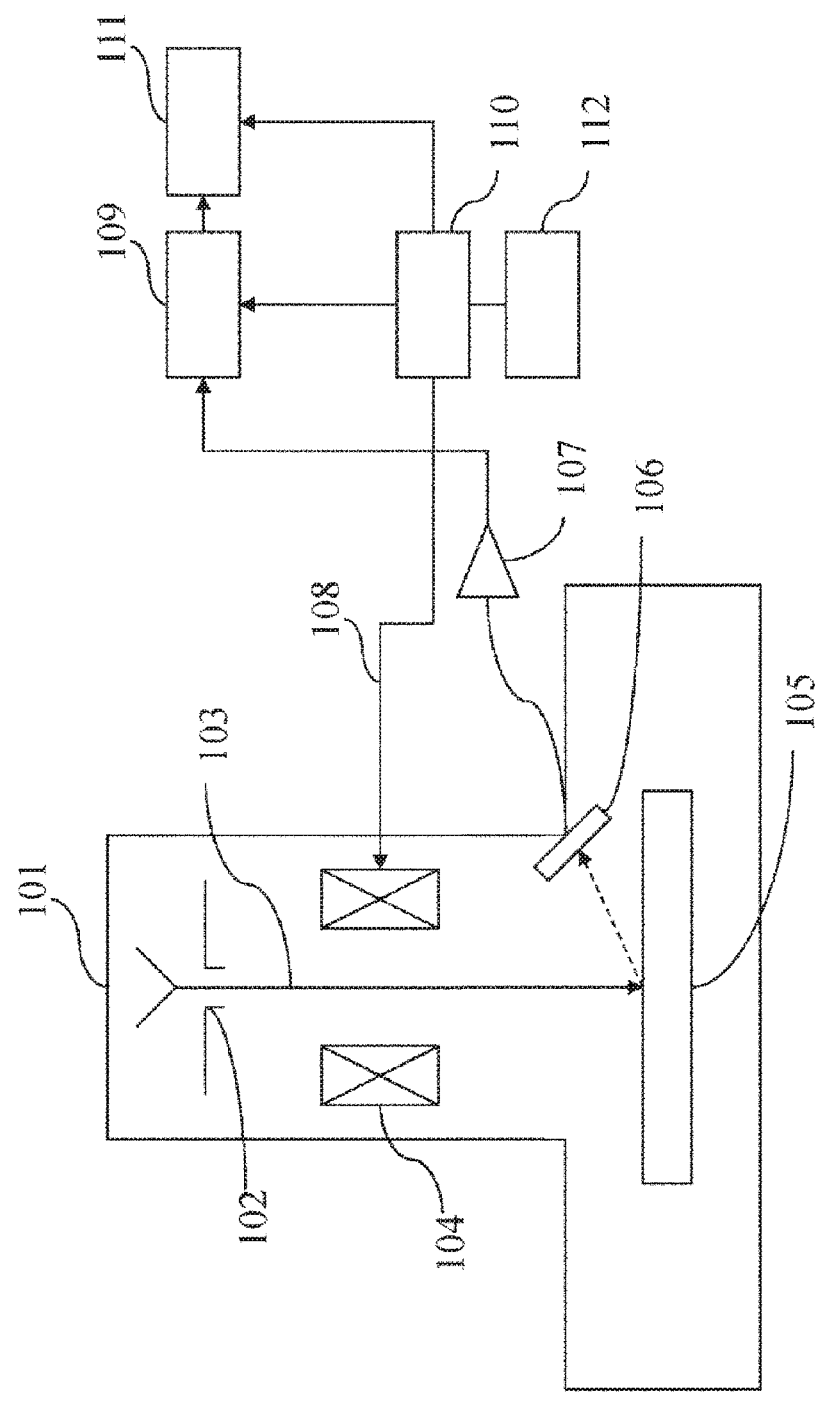
[Fig. 1]

[Fig. 2]
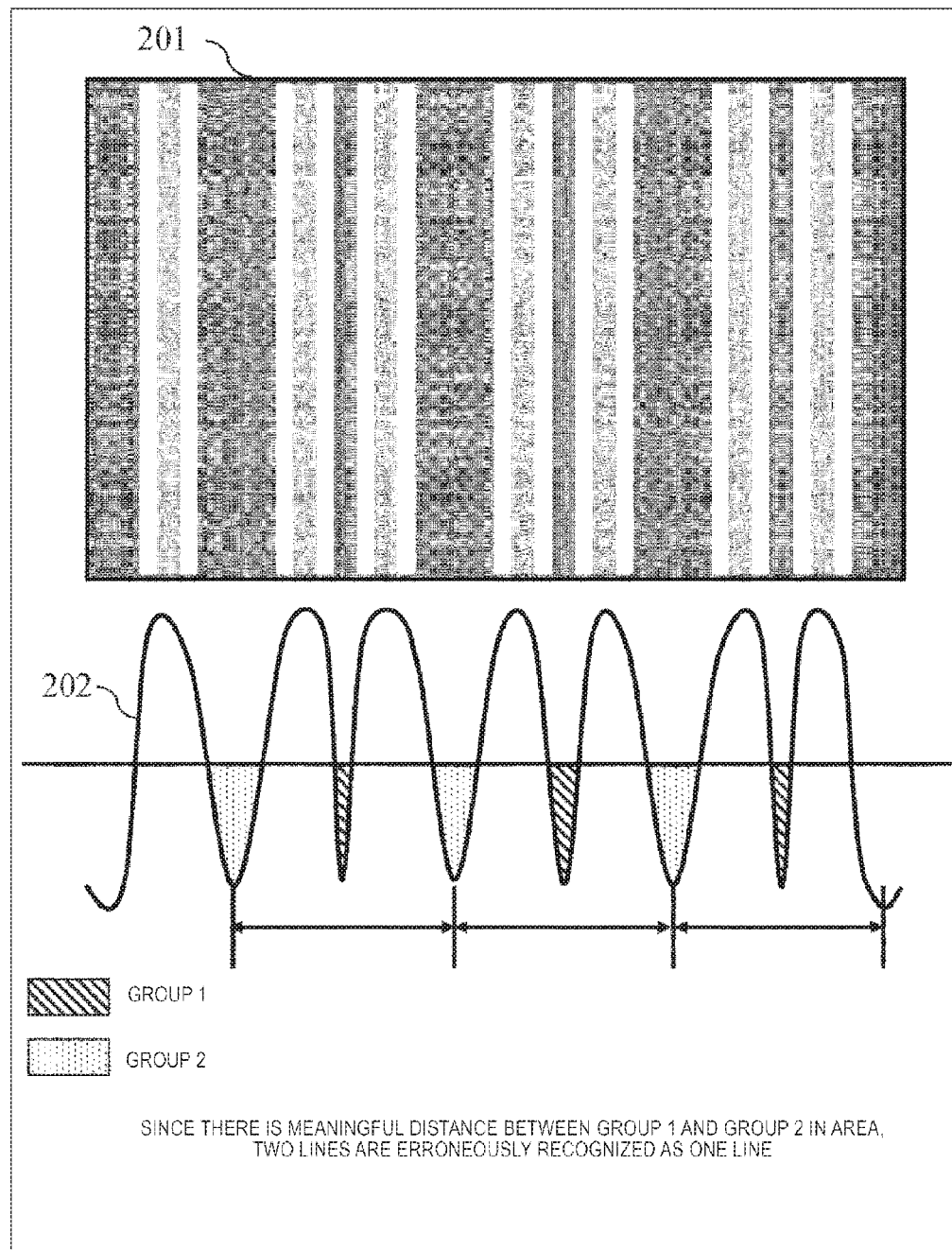

[Fig. 3]
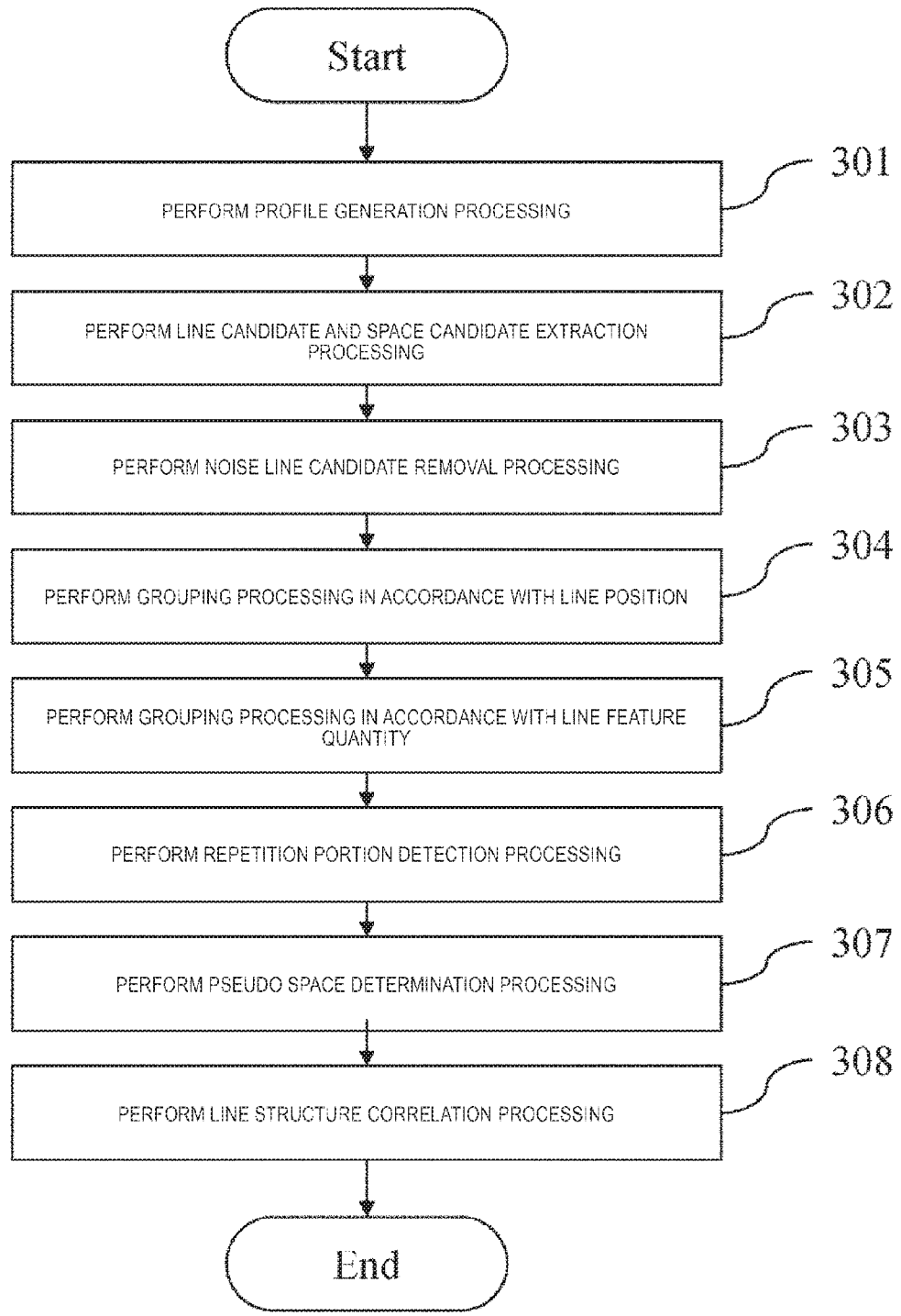

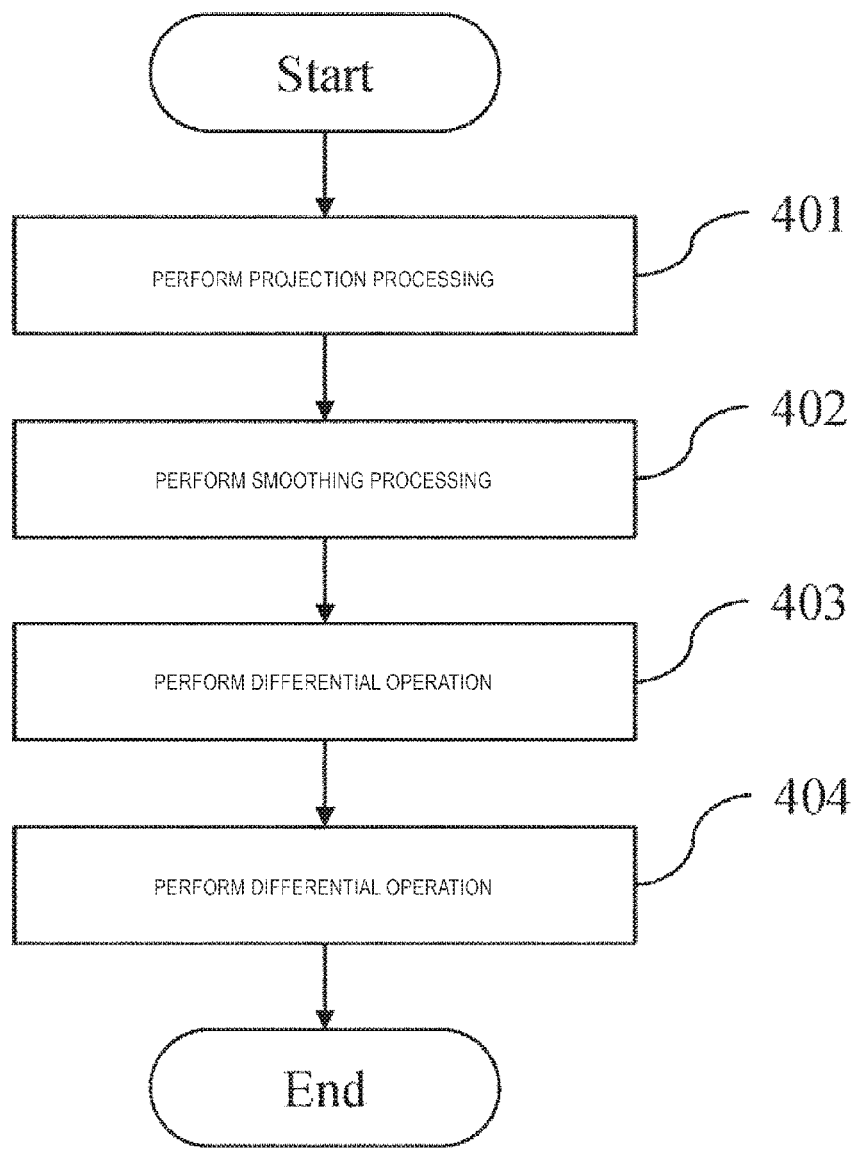
[Fig. 4]

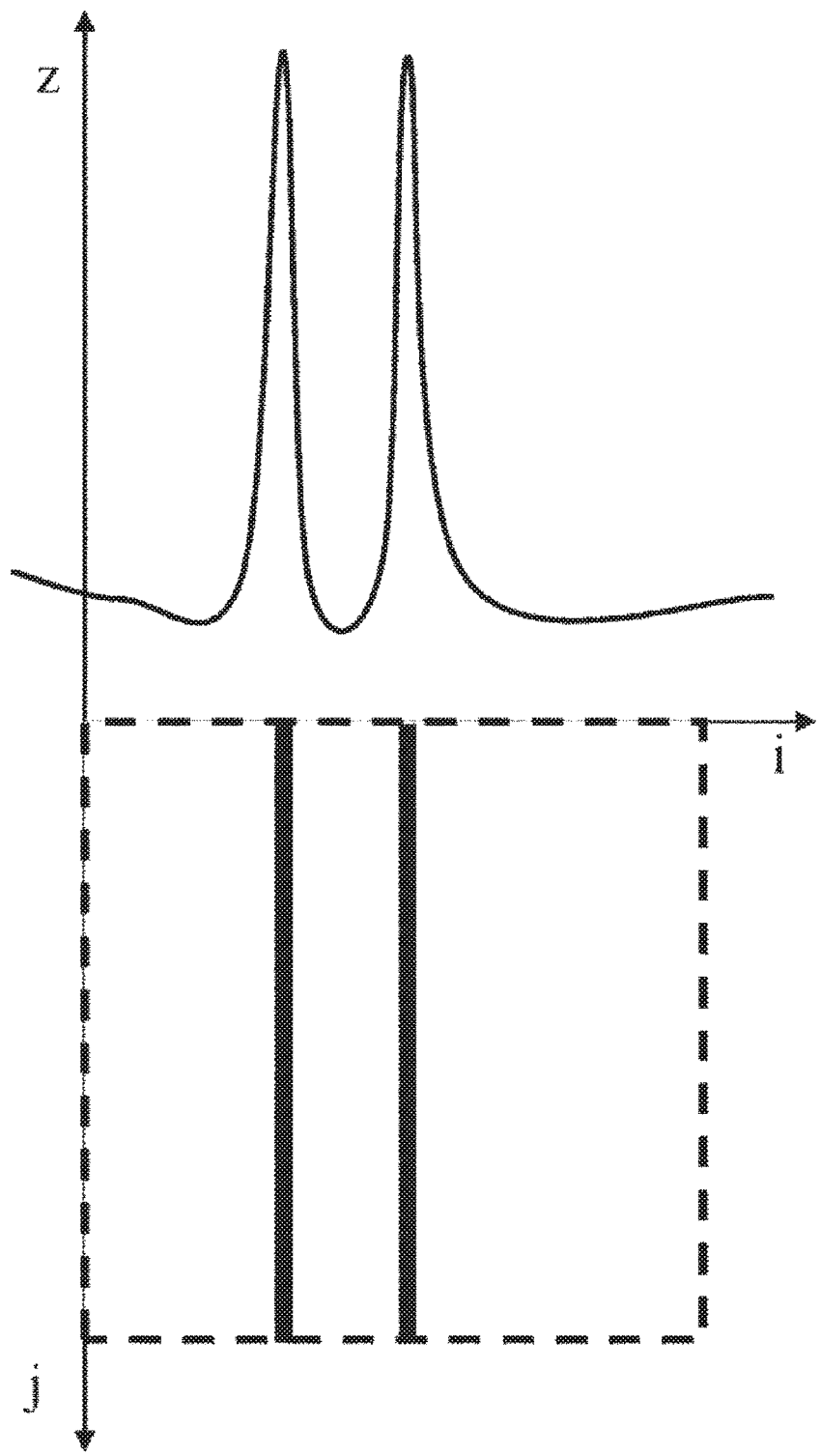
[Fig. 5]

[Fig. 6]
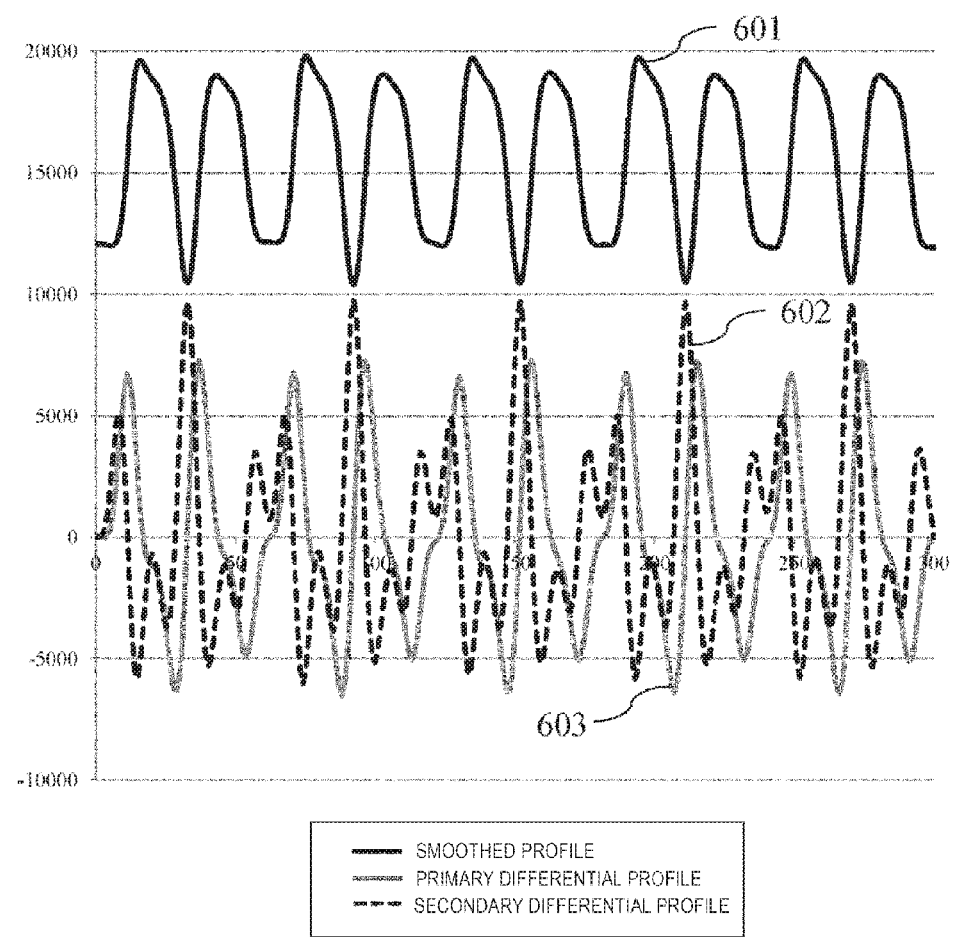

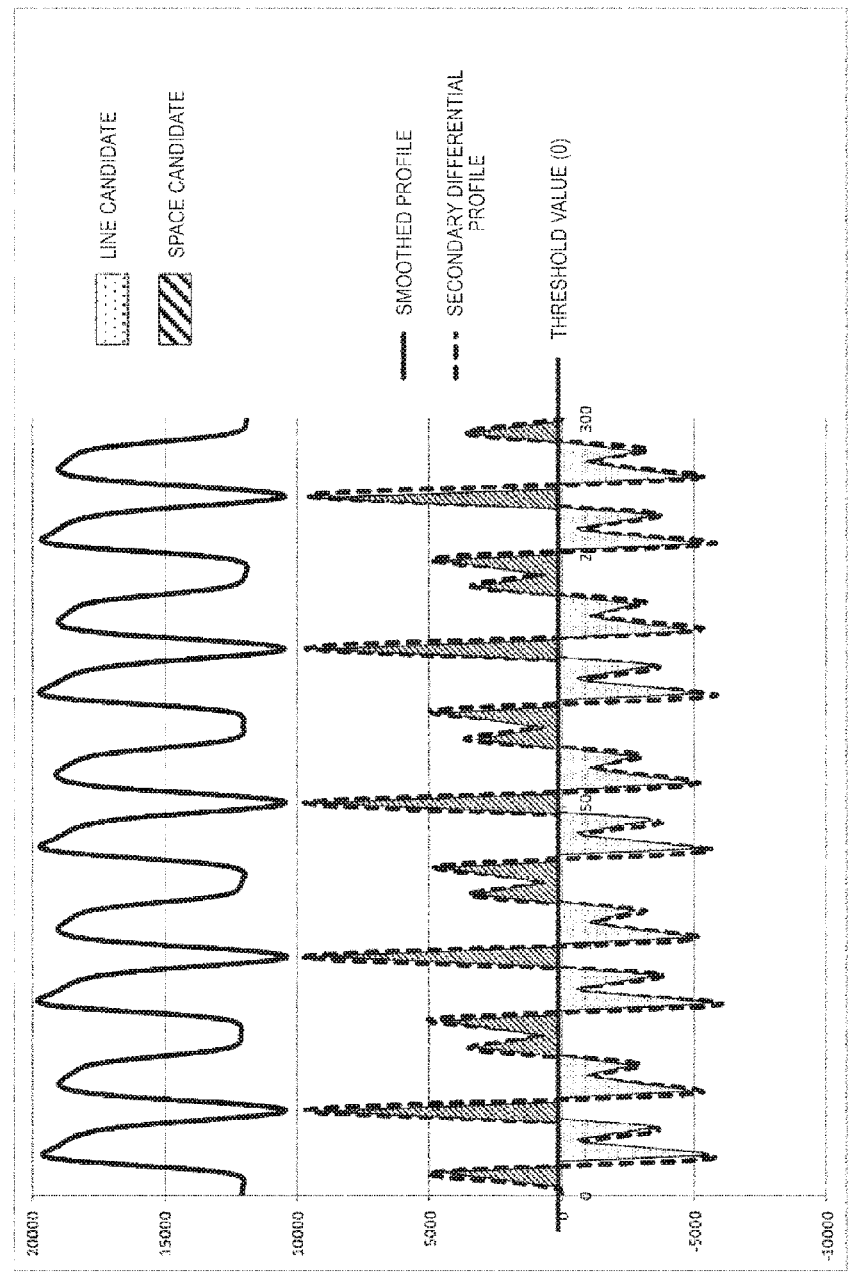
[Fig. 7]

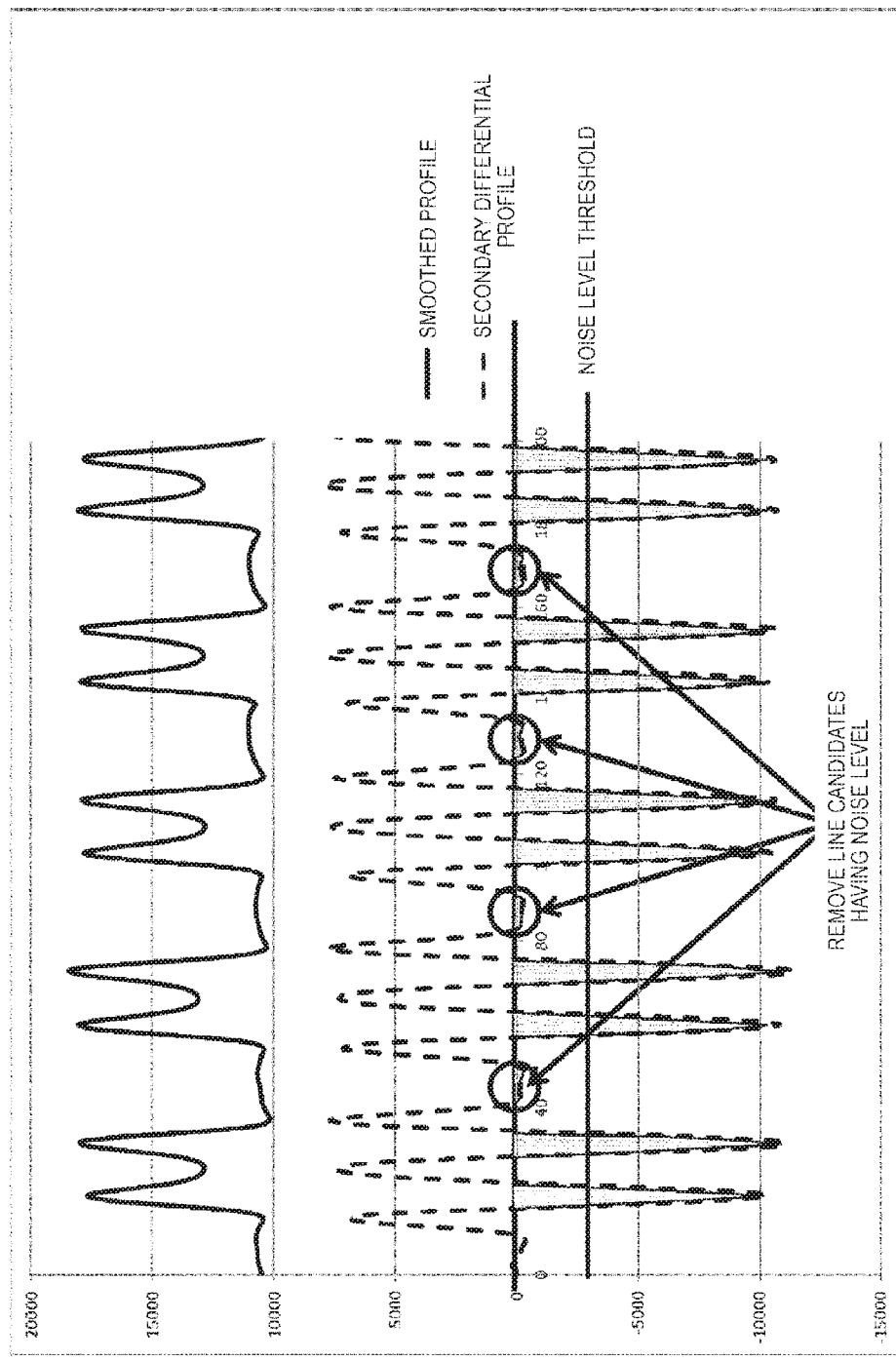
[Fig. 8]

[Fig. 9A]
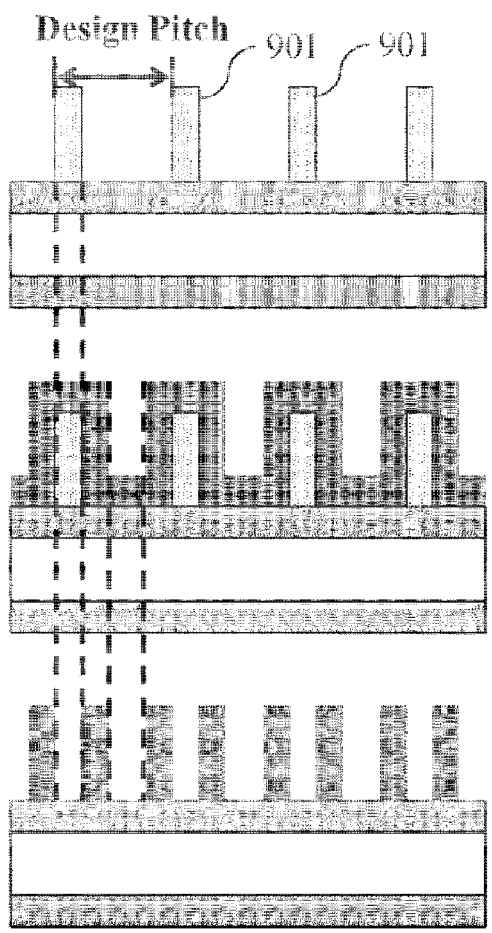
[Fig. 9B]
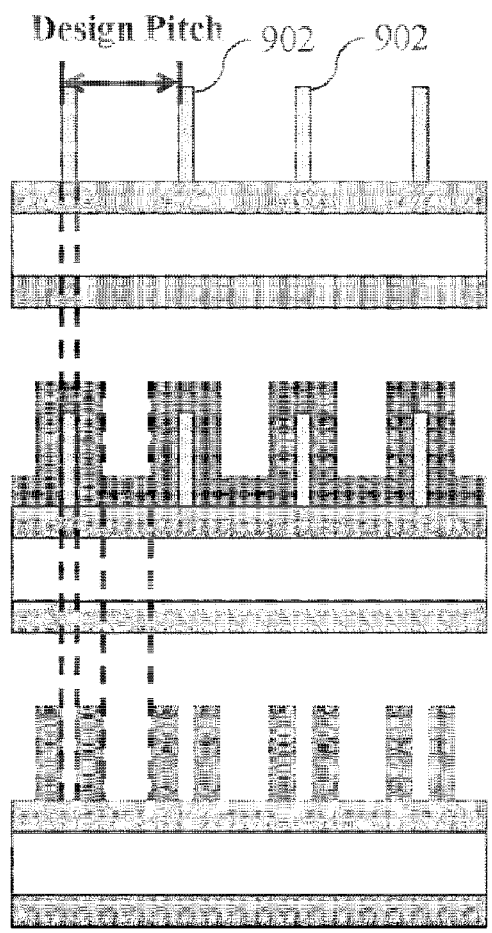

[Fig. 10]
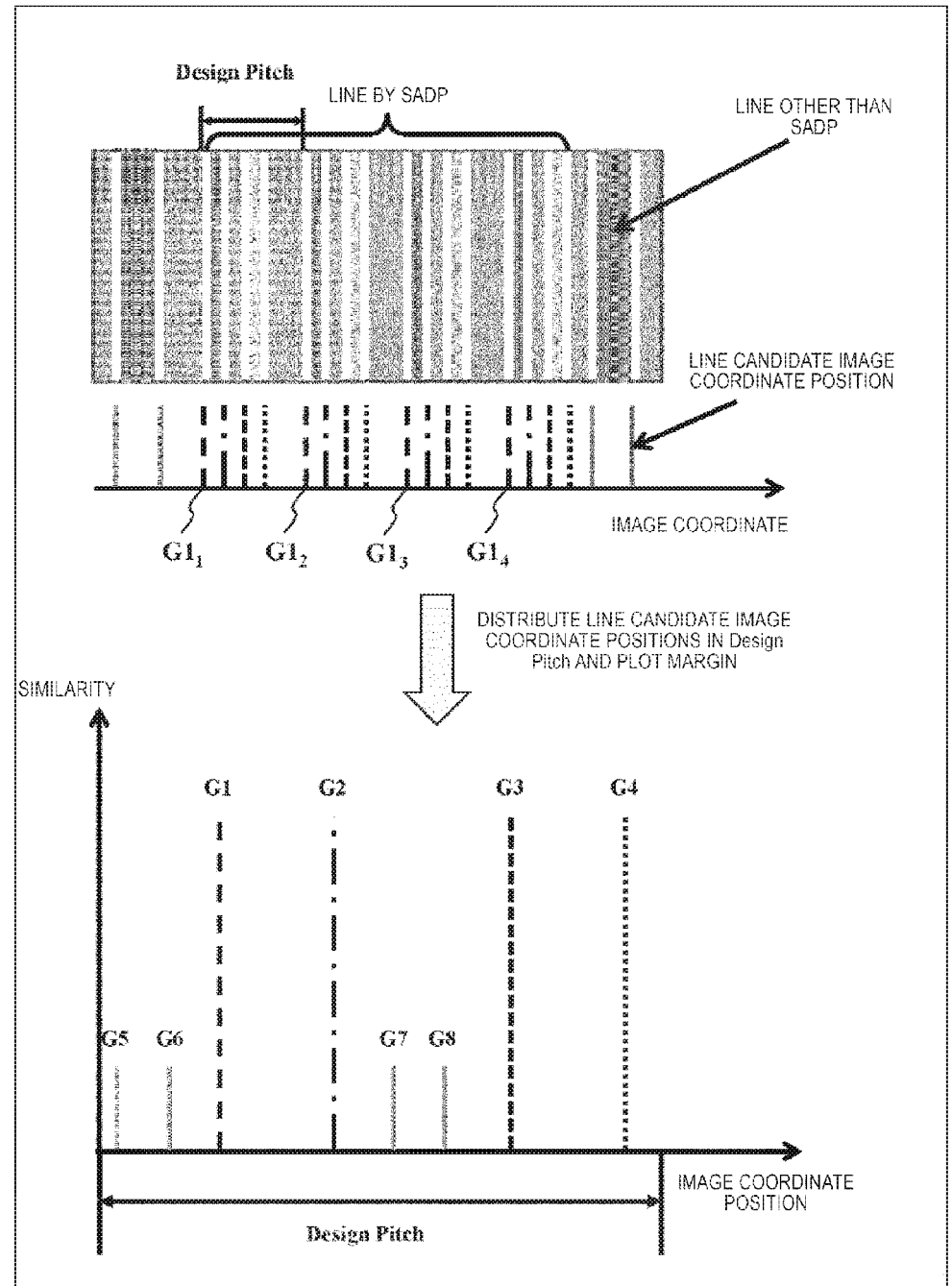

[Fig. 11]
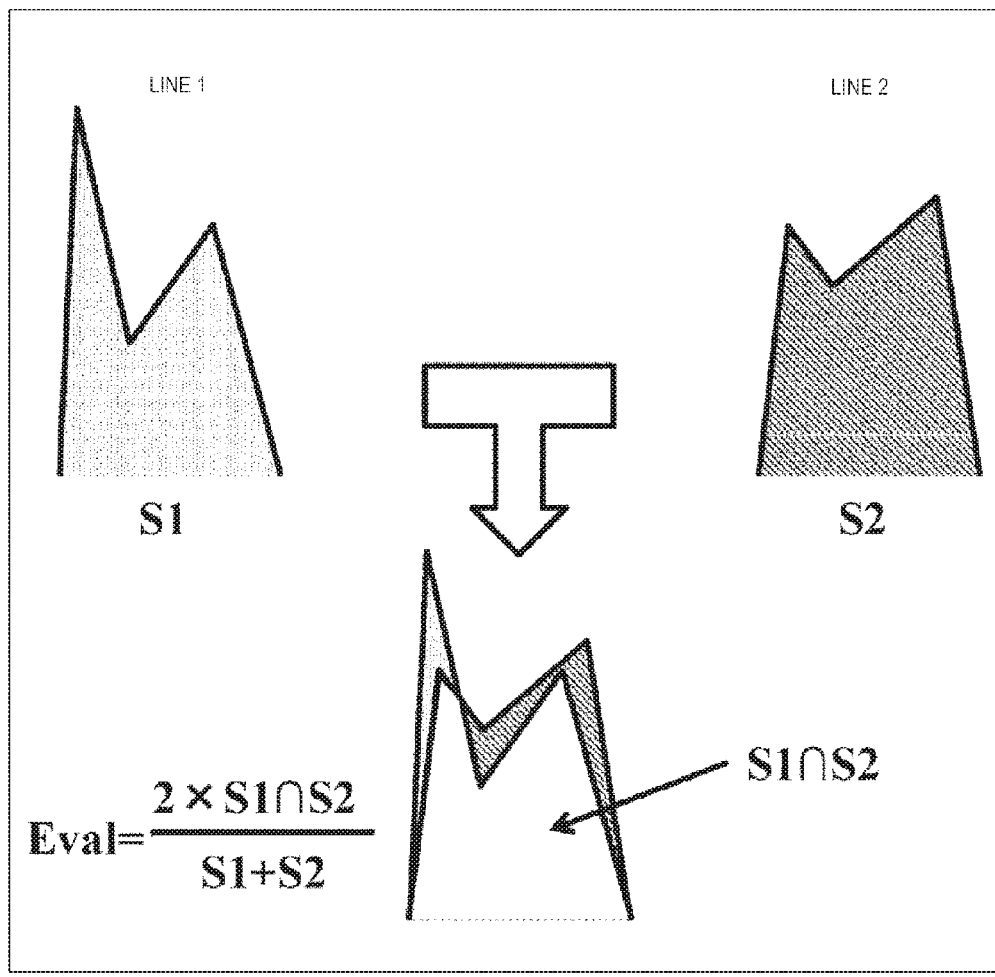

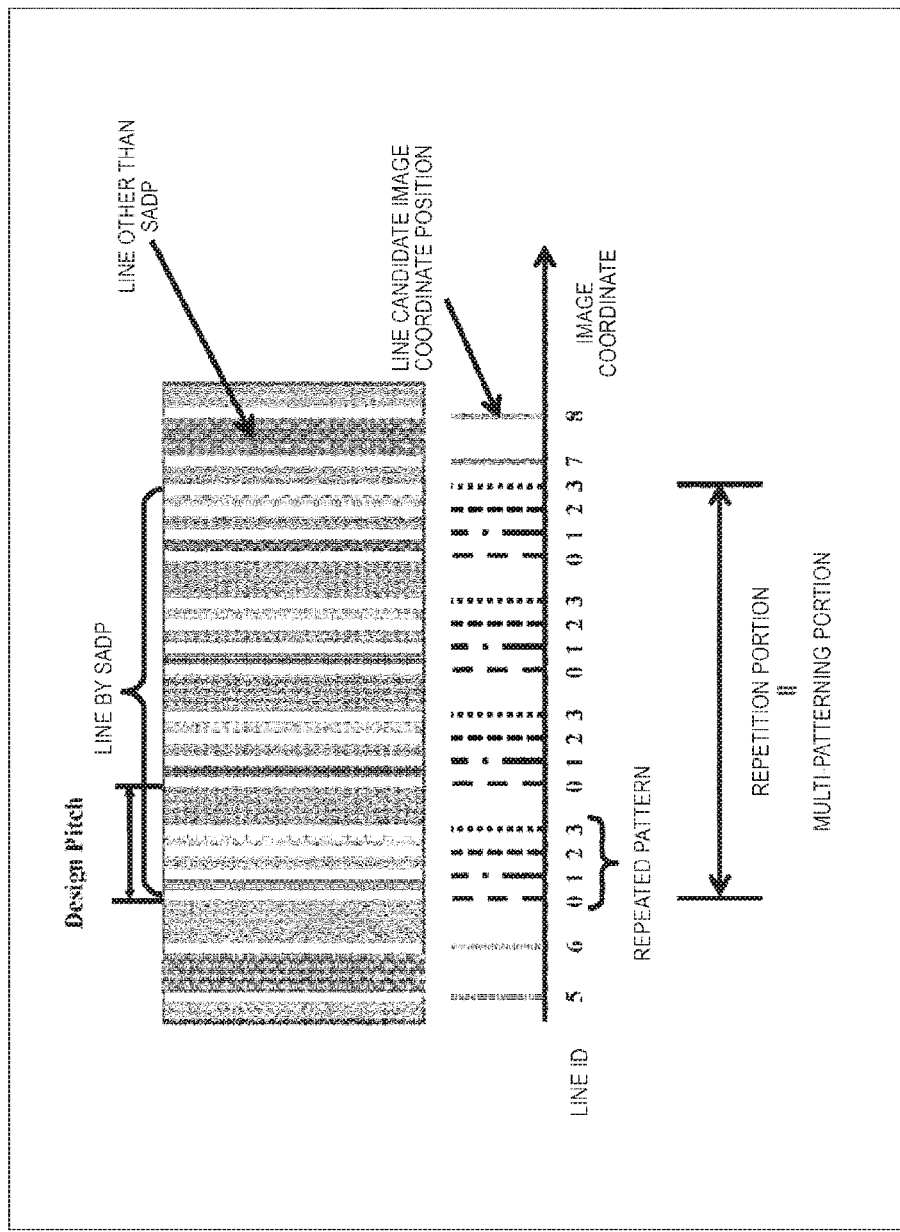

[Fig. 13]
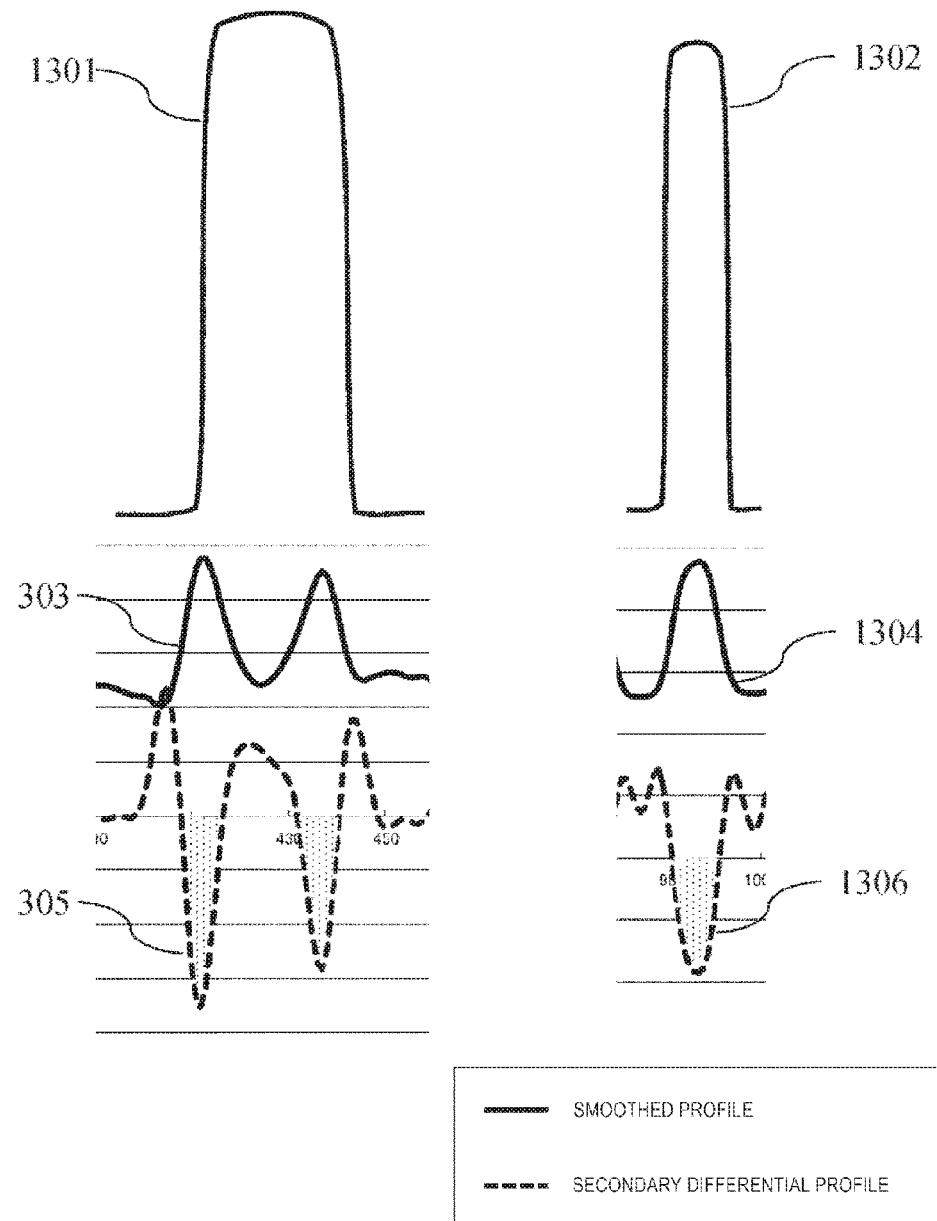

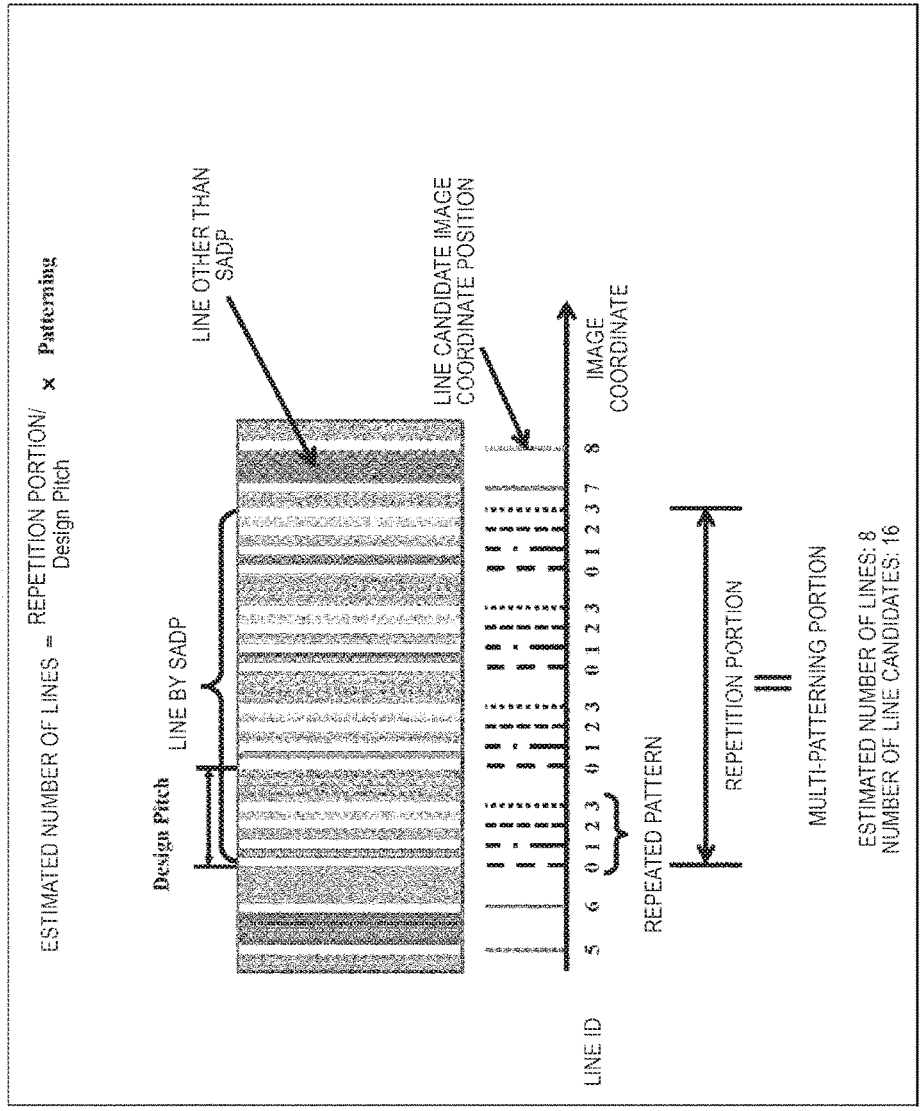
[Fig. 14]

[Fig. 15]
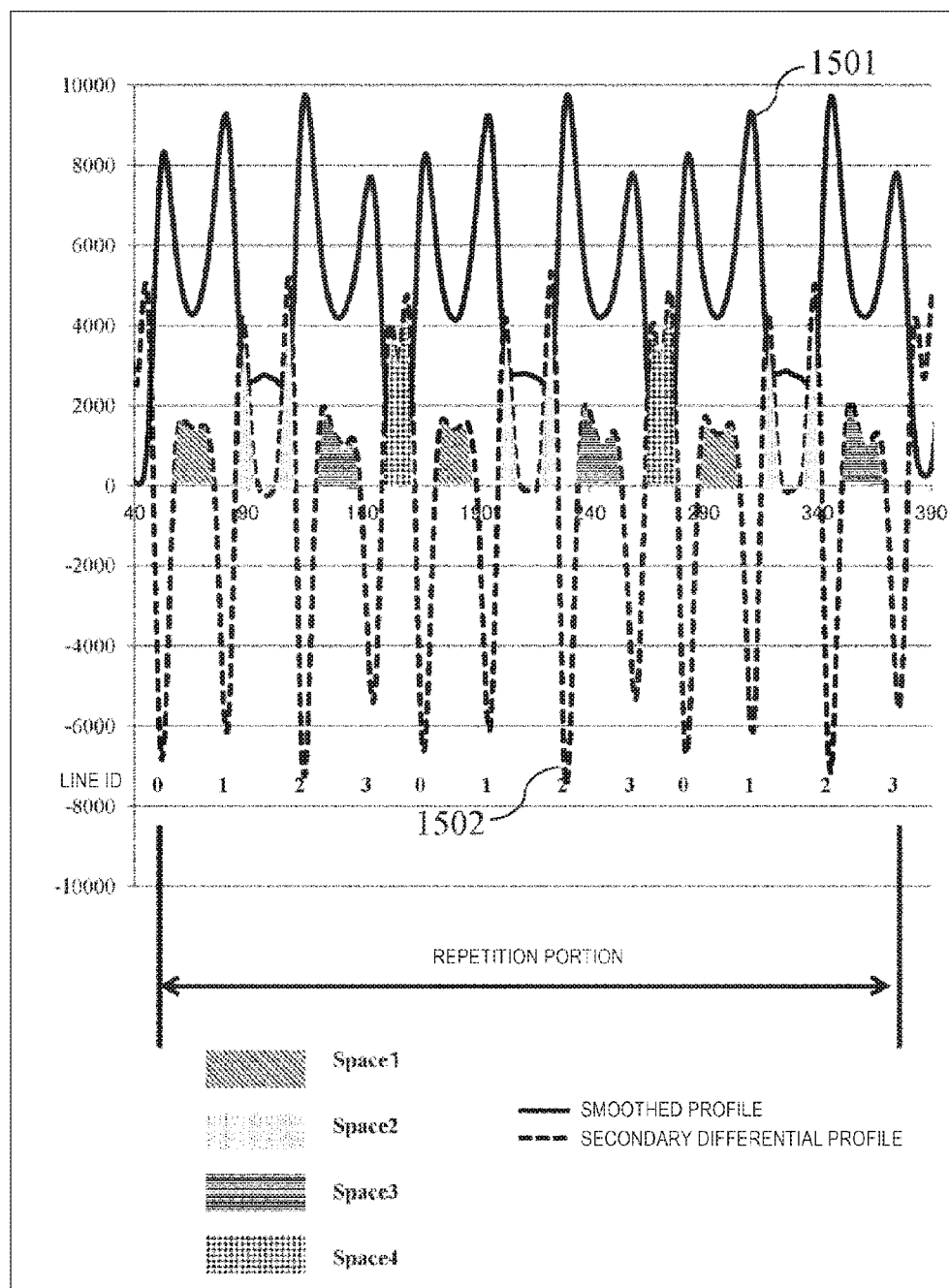

[Fig. 16]
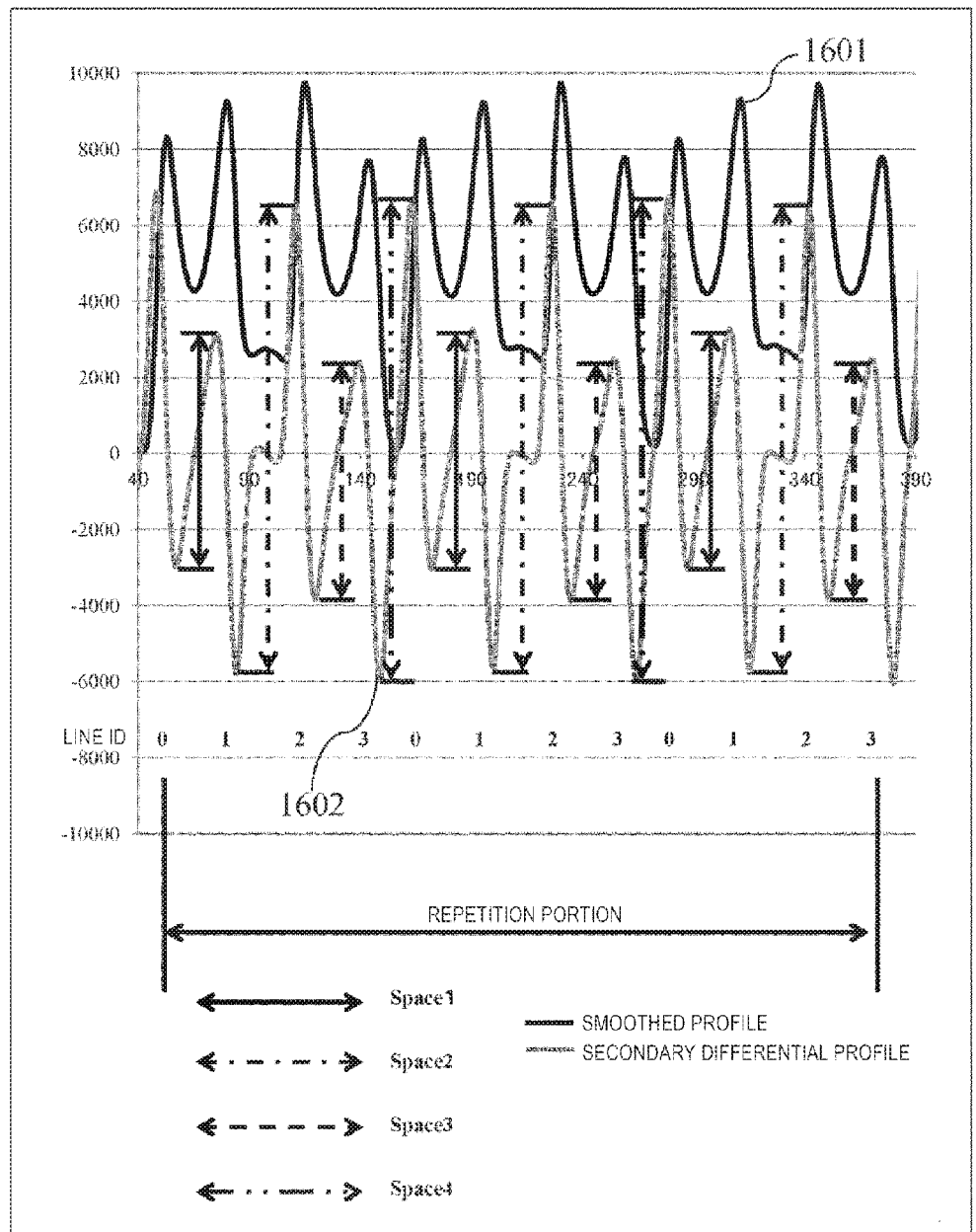

[Fig. 17]
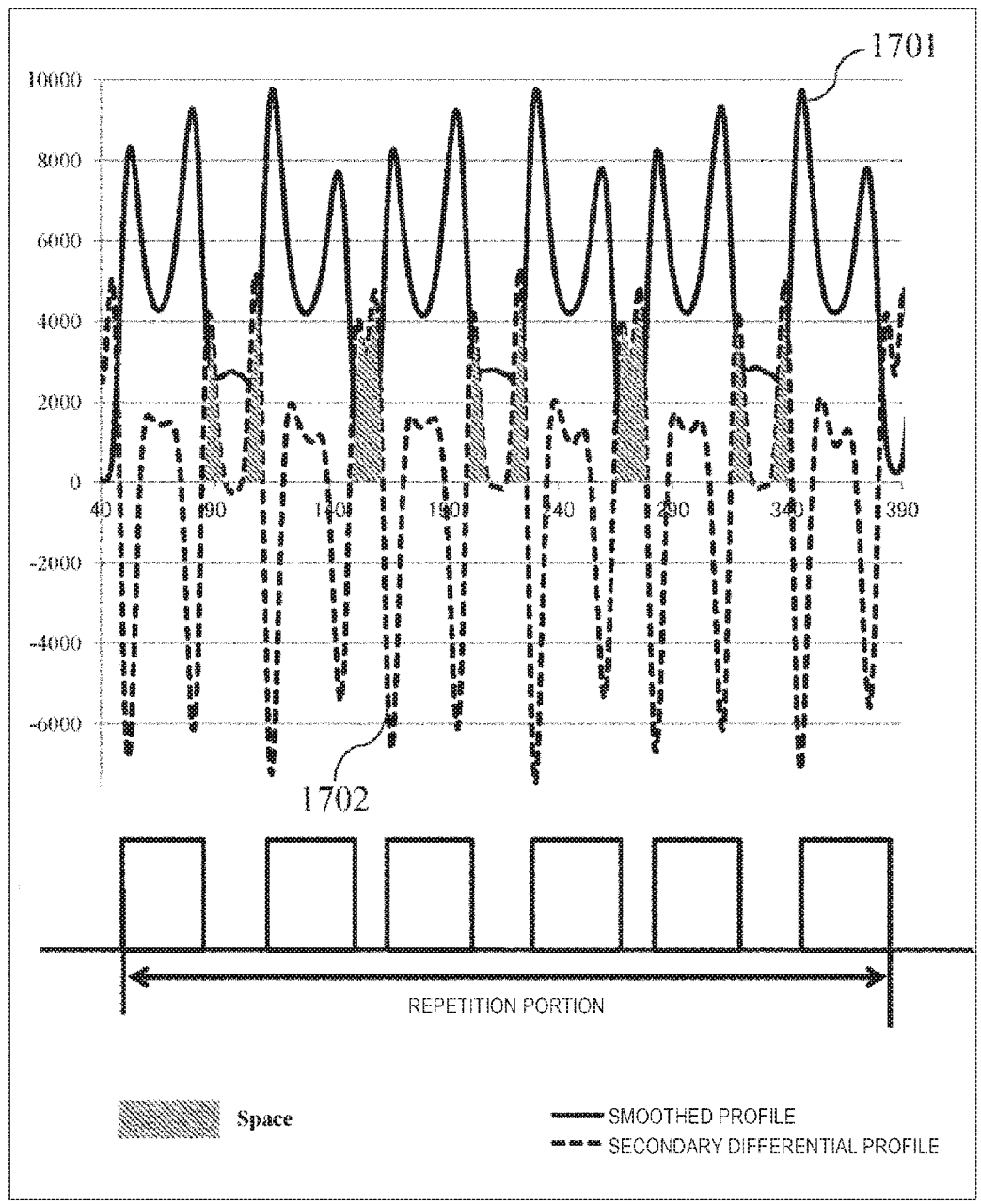

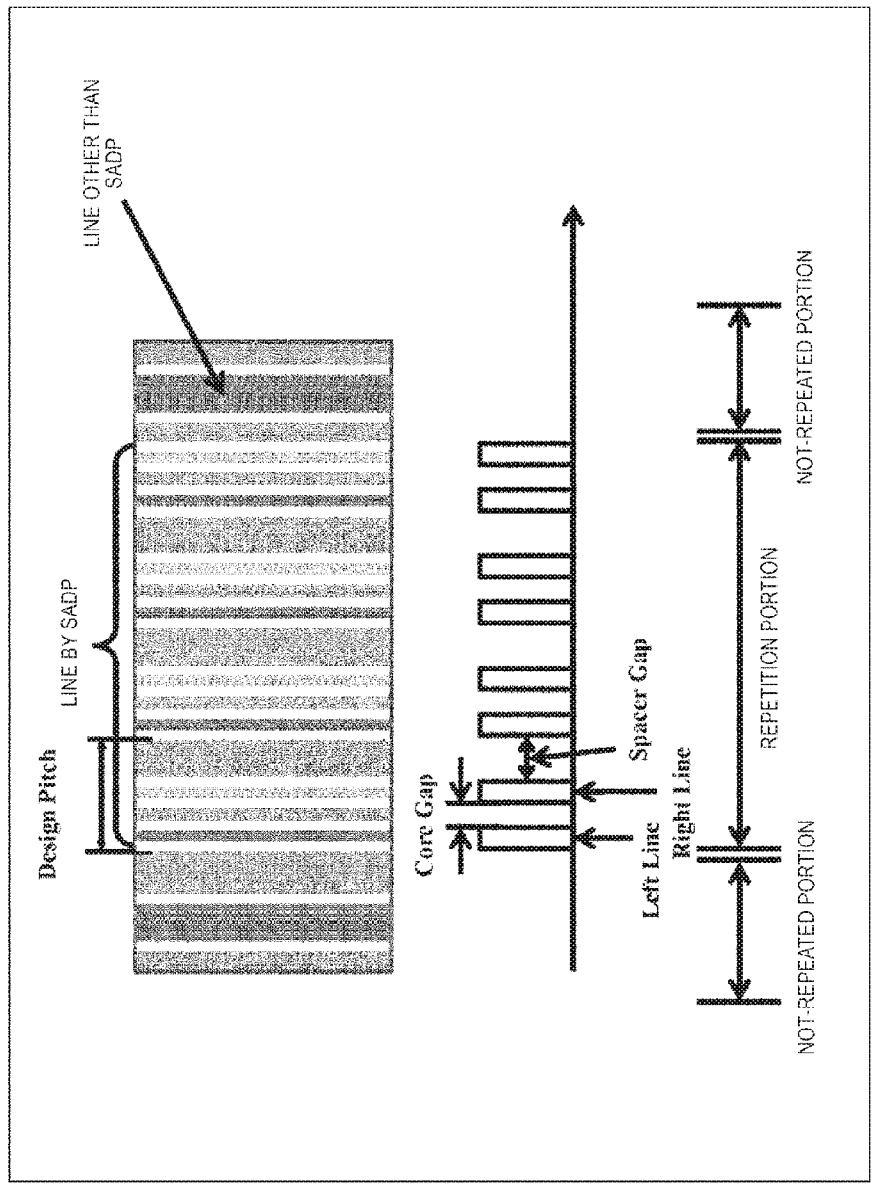
[Fig. 18]

[Fig. 19]
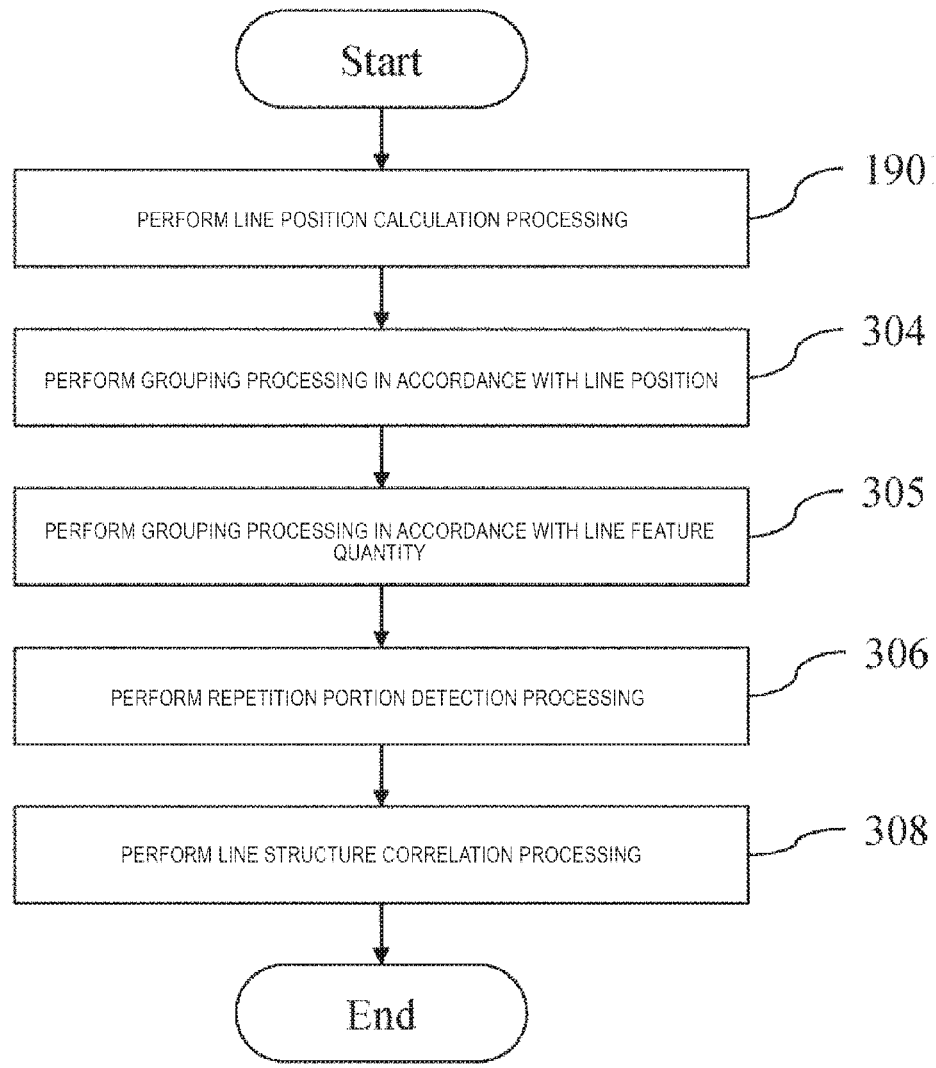

[Fig. 20]
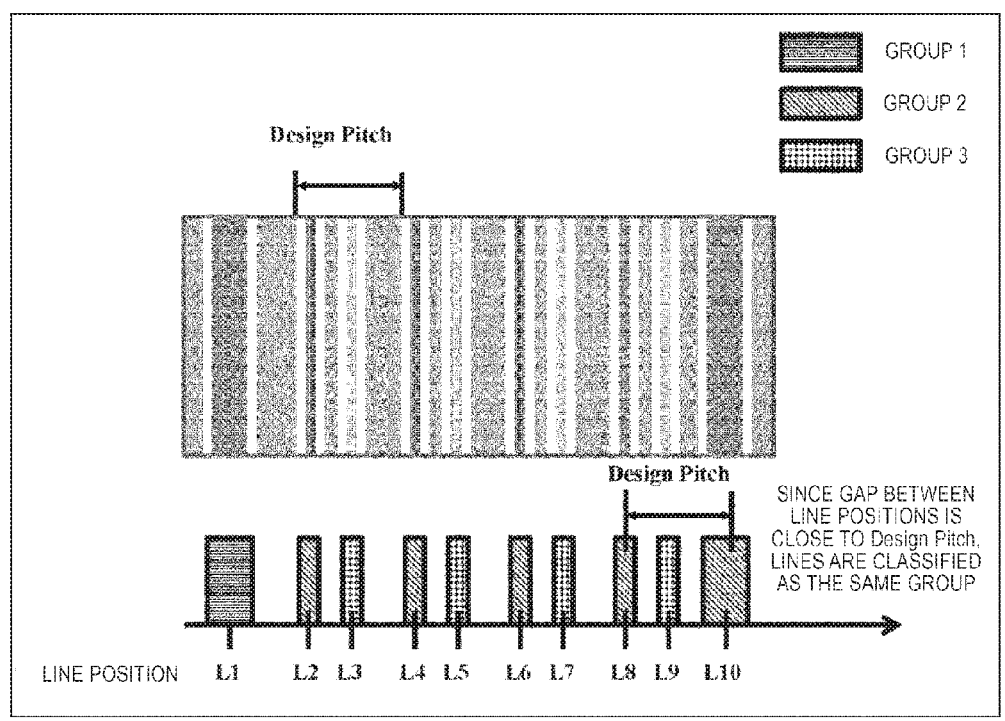

[Fig. 21]
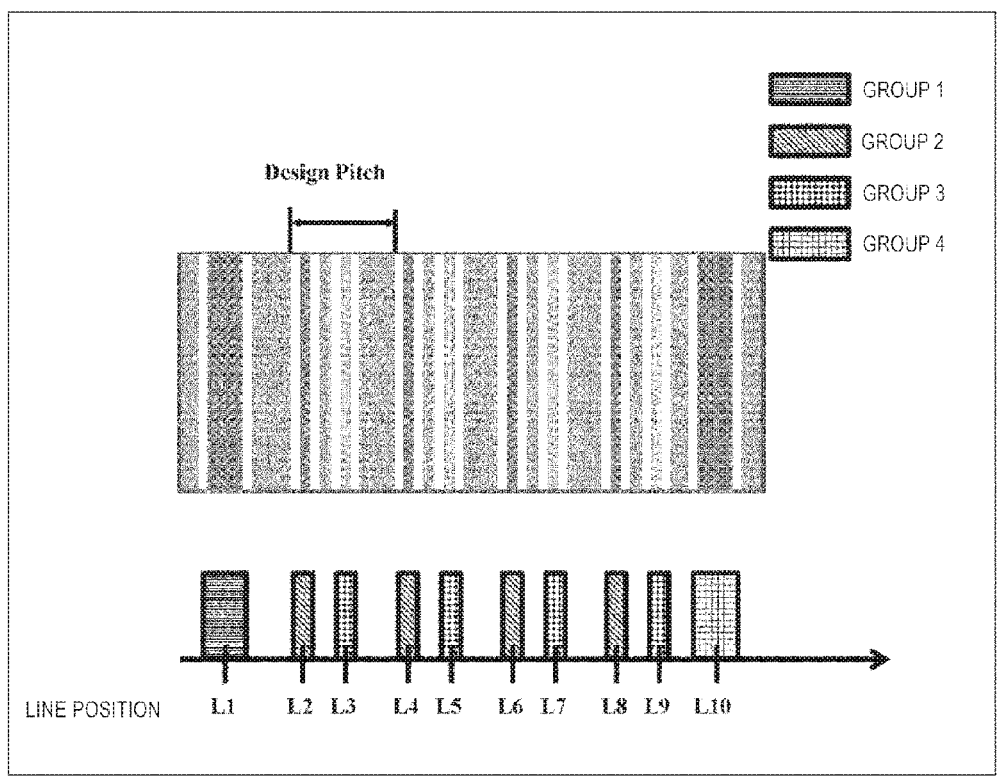

[Fig. 22]
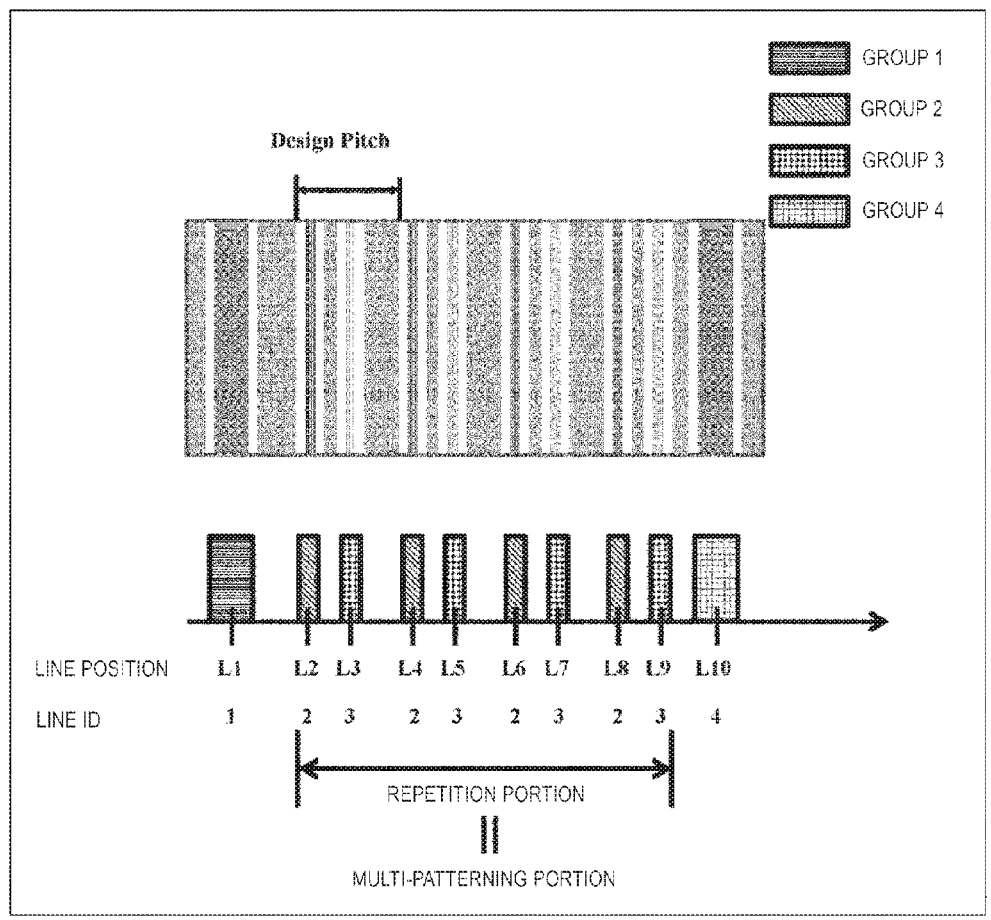

[Fig. 23]
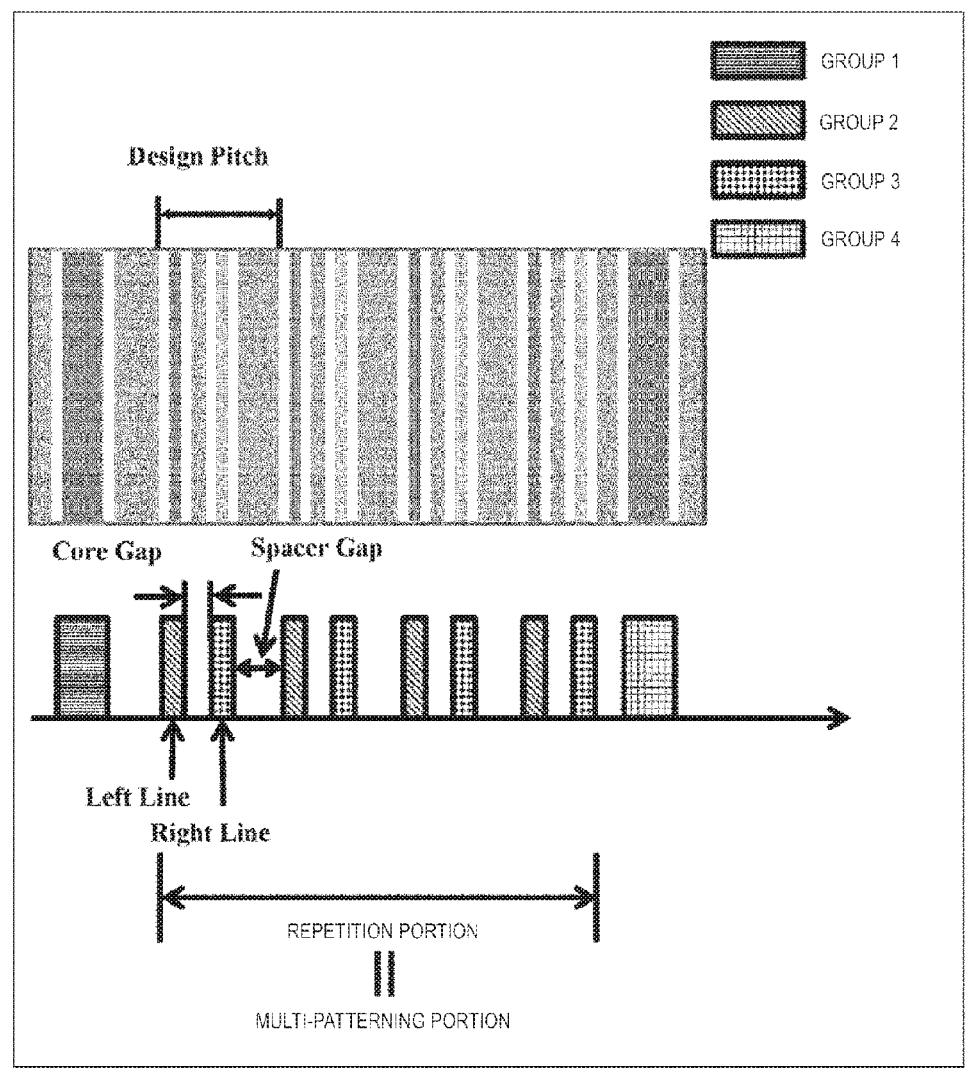

[Fig. 24]
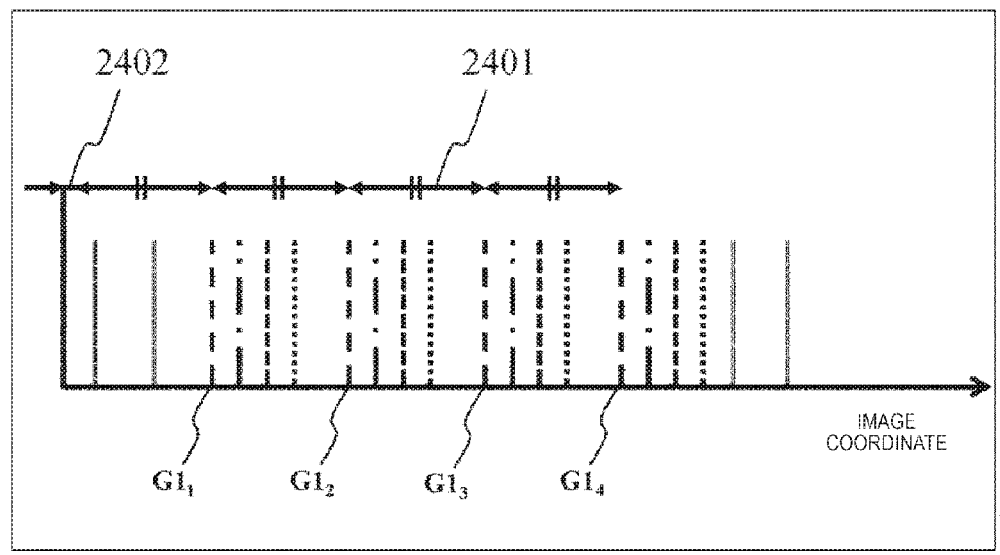

[Fig. 25]
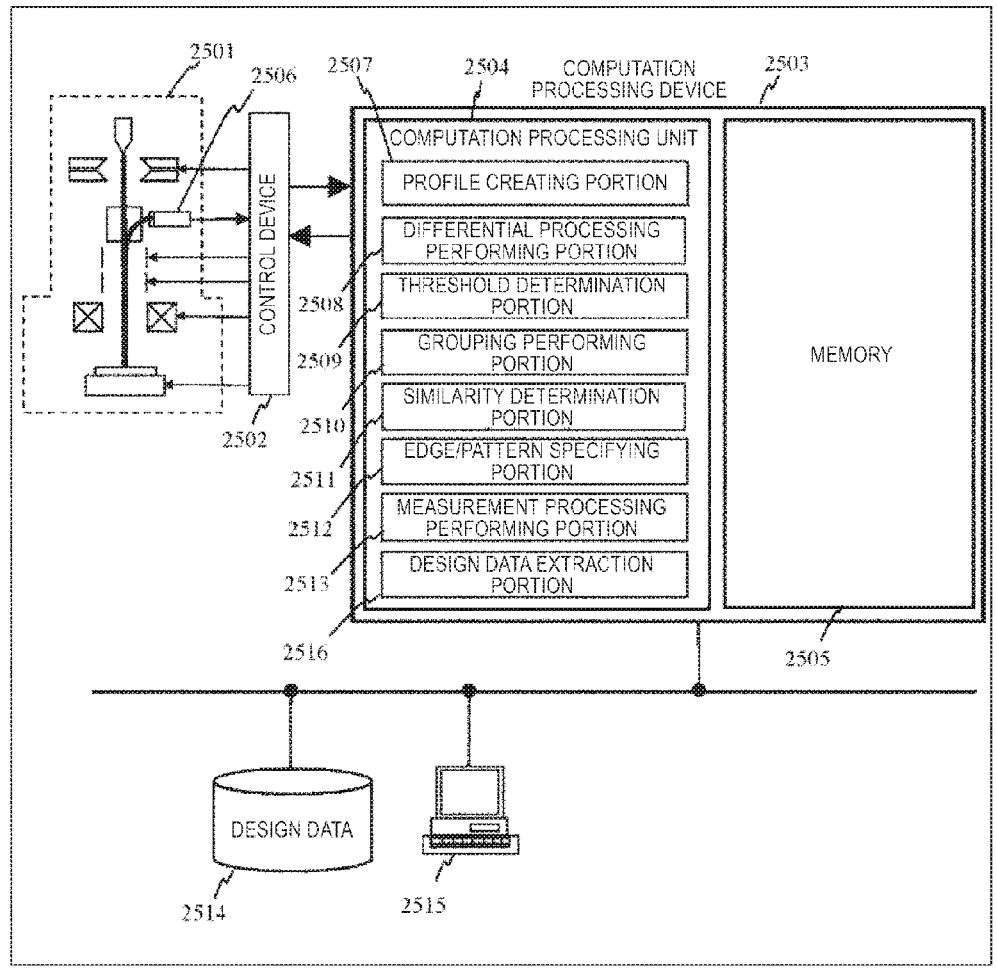

[Fig. 26]
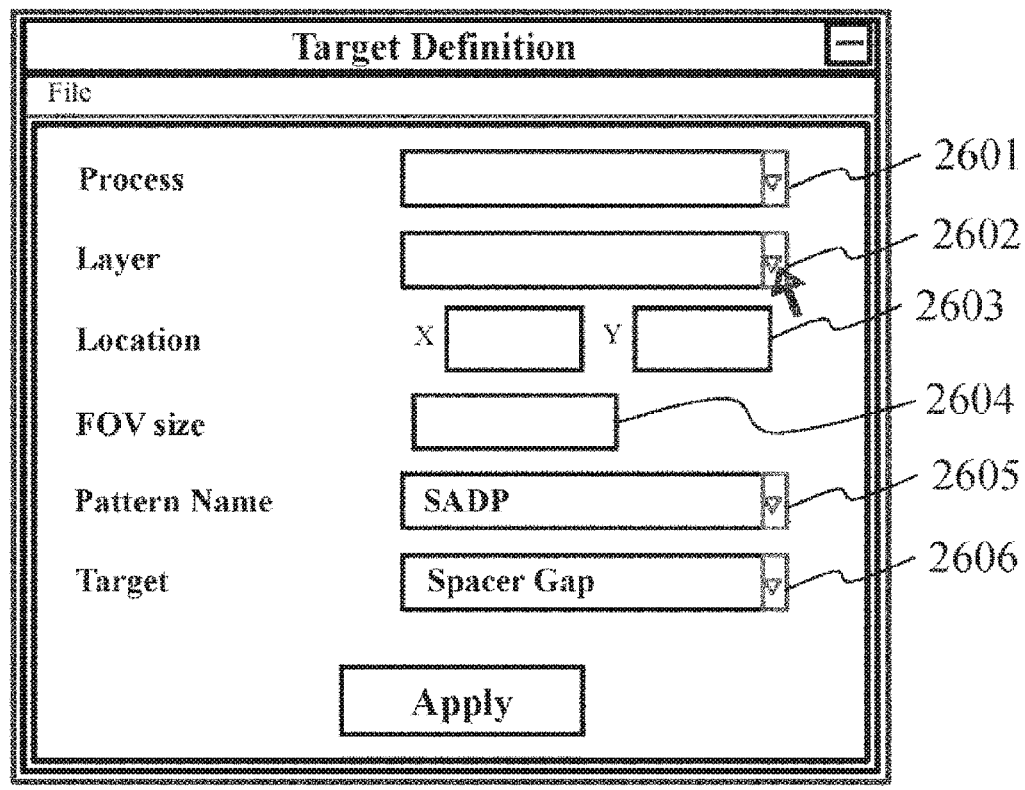

PATTERN MEASUREMENT DEVICE AND COMPUTER PROGRAM

TECHNICAL FIELD

The present invention relates to a pattern measurement device and a computer program, particularly to a device which executes at least one of distinguishment and selection of a pattern formed on a semiconductor wafer by a multi-patterning method such as SADP, SAQP, SAOP, and selective measurement of a specific pattern; and a computer program.

BACKGROUND ART

A charged particle beam device such as a scanning electron microscope is a device appropriate for measuring or observing a pattern which is formed on a semiconductor wafer while in the process of increased fineness. In the related art, as a method of obtaining three-dimensional information of a sample in a charged particle beam device, particularly, obtaining unevenness information of the sample, in PTL 1, areas of portions at which a profile is lower than a predetermined height in an area formed by the profile and the predetermined height are calculated. When the calculated areas are classified into two groups of a group of large areas and a group of small areas, if there is a sufficiently meaningful difference between the two groups, portions corresponding to the group of large areas are judged as a concave portion, and the other portions are judged as a convex portion. If the difference between the two groups is not sufficiently meaningful, portions corresponding to the two groups are judged as concave portion, and the other portions are judged as a convex portion. Thus, the unevenness information is obtained.

Regarding lines generated in double patterning, in PTL 2, a luminance difference between two peaks of the right and left lines which are adjacent to a space set as a target, a distance from a point of the center portion of the line, which has the minimum luminance value, to a point of the line close to the space, which has a peak, average luminance, and the like are set as a feature quantity, and thus it is distinguished which space is a core space or a gap space.

CITATION LIST

Patent Literature

PTL 1: International Publication No. WO2012/056639 (specification in corresponding U.S. Patent Publication No. 2013/0270436)
PTL 2: JP-A-2012-51939 (specification in corresponding U.S. Pat. No. 8,538,130)

SUMMARY OF INVENTION

Technical Problem

In a case where the length of a pattern of a line or a space on a sample is measured by using the scanning electron microscope, accurate recognition between the line and the space is difficult. Particularly, accurate recognition or distinguishment of a line generated in multi-patterning becomes more difficult. For example, in a pattern formed by an SADP (self aligned double patterning) method, if a thin film formed in the patterning process is not appropriately coated, the position of the pattern may be deviated.

FIG. 2 illustrates an example of lines formed in double patterning. The reference sign of 201 indicates an SEM image and the reference sign of 202 indicates a profile of a section. For example, in the SADP, a control in a process of slimming, deposition, or the like is insufficient. Thus, positions of lines which are to be ideally arrayed at an equal interval are deviated.

In PTL 1, areas of portions at which a profile is lower than a predetermined height in an area formed by the profile and the predetermined height are calculated. When the calculated areas are classified into two groups of a group of large areas and a group of small areas by a predetermined method, a meaningful difference between the two groups is detected, and thus the unevenness of the lines are judged.

However, in a case where lines are deviated as in the example of FIG. 2, since a meaningful difference exists between Group 1 and Group 2, two lines may be judged as one line, and accurate judgement of unevenness may be difficult.

In PTL 2, a luminance difference between two peaks of the right and left lines which are adjacent to a space set as a target, a distance from a point of the center portion of the line, which has the minimum luminance value, to a point of the line close to the space, which has a peak, average luminance, and the like are set as a feature quantity, and thus it is distinguished which space is a core space or a gap space.

However, the increased fineness of the recent pattern causes a difference between the feature quantity of a core space side and the feature quantity of a gap space side to be reduced. That is, distinguishment on the basis of the difference between the feature quantities becomes difficult. If a pattern is deviated as described above, determination by using the feature quantity may be difficult.

In the following descriptions, a pattern measurement device and a computer program will be described. An object of the pattern measurement device and a computer program is to accurately and stably perform measurement on the basis of a pattern or edge judgment or edge identification, regardless of increased fineness, deviation, or the like of a pattern.

Solution to Problem

According to an aspect for achieving the abovementioned object, there is provided a pattern measurement device and a computer program causing a computer to execute the following processes. When the pattern measurement device measures a measurement target pattern by using a waveform signal obtained by scanning a pattern with a charged particle beam, the pattern measurement device classifies pattern sites which are repeatedly arrayed at a specific interval, in accordance with positions of the pattern sites on the basis of the waveform signal, and executes a pattern edge type identification, a pattern type identification, or measurement of dimensions between predetermined pattern sites, on the basis of association between the classified pattern site, and information pertaining to a pattern edge type, or information pertaining to a pattern type.

Advantageous Effects of Invention

According to the above configuration, regardless of increased fineness, deviation, or the like of a pattern, a measurement may be accurately and stably performed on the basis of edge identification or pattern or edge judgment.

BRIEF DESCRIPTION OF DRAWINGS

FIG. 1 is a diagram illustrating a configuration example of a scanning electron microscope system in Example 1 of the present invention.

FIG. 2 is a diagram illustrating an example of a line generated in double patterning in Example 1 of the present invention.

FIG. 3 is a diagram illustrating an outline of multi-patterning portion judgement processing in Example 1 of the present invention.

FIG. 4 is a diagram illustrating an outline of profile generation processing in Example 1 of the present invention.

FIG. 5 is a diagram illustrating an outline of projection processing in Example 1 of the present invention.

FIG. 6 is a diagram illustrating an example of a profile generated by the profile generation processing in Example 1 of the present invention.

FIG. 7 illustrates a result of line candidates and space candidates extracted by line candidates-space candidate extraction processing in Example 1 of the present invention.

FIG. 8 is a diagram illustrating an outline of noise line candidate removal processing in Example 1 of the present invention.

FIGS. 9A and 9B are diagrams illustrating an outline of SADP processing in Example 1 of the present invention (a: ideal case and b: case of excessively performing slimming).

FIG. 10 is a diagram illustrating an outline of grouping processing in accordance with a line position in Example 1 of the present invention.

FIG. 11 is a diagram illustrating an outline of similarity in Example 1 of the present invention.

FIG. 12 is a diagram illustrating an outline of repetition portion detection processing in Example 1 of the present invention.

FIG. 13 is a sectional view illustrating a line pattern and a diagram illustrating a profile of the line pattern in Example 1 of the present invention.

FIG. 14 is a diagram illustrating pseudo space judgement processing in Example 1 of the present invention.

FIG. 15 is a diagram illustrating an example of a feature quantity used in pseudo space judgement, in Example 1 of the present invention.

FIG. 16 is a diagram illustrating an example of a feature quantity used in the pseudo space judgement, in Example 1 of the present invention.

FIG. 17 is a diagram illustrating a result example in which the pseudo space judgement is applied to the figure of FIG. 15 in Example 1 of the present invention.

FIG. 18 is a diagram illustrating a result example in which sites in multi-patterning are associated with the figure of FIG. 14, in Example 1 of the present invention.

FIG. 19 is a diagram illustrating an outline of multi-patterning portion judgement processing in Example 2 of the present invention.

FIG. 20 is a diagram illustrating a result obtained by performing grouping processing (Step 304) in accordance with a line position, by using an example of a line pattern in FIG. 10 in Example 2 of the present invention.

FIG. 21 is a diagram illustrating a result obtained by performing grouping processing (Step 305) on the result in FIG. 20, in accordance with a line feature quantity in Example 2 of the present invention.

FIG. 22 is a diagram illustrating a result obtained by performing repetition portion detection processing (Step 305) on the result in FIG. 21, in Example 2 of the present invention.

FIG. 23 is a diagram illustrating a result obtained by performing line structure association processing (Step 308) on the result in FIG. 22, in Example 2 of the present invention.

FIG. 24 is a diagram illustrating the principle of performing distinguishment of an edge on the basis of division of an edge coordinate by a design pitch.

FIG. 25 is a diagram illustrating an outline of a pattern measurement system including a scanning electron microscope.

FIG. 26 is a diagram illustrating an example of a graphical user interface (GUI) screen for setting a measurement condition of a pattern.

DESCRIPTION OF EMBODIMENTS

In examples which will be described below, a method and a device in which for example, even when lines as in the example of FIG. 2 are formed so as to be deviated or extraction of a feature quantity is difficult due to increased fineness, unevenness and the like of a pattern formed on a sample is appropriately judged and a portion in multi-patterning, which corresponds to the judged unevenness is distinguished will be described.

In the examples which will be described below, mainly, a device and a computer program in which regarding a profile formed from a detection signal obtained by scanning a sample with a charged particle beam, positions of line candidates or edges are classified on the basis of a predetermined gap, and a repetition portion is detected from the classified line candidates or edges, and thus a multi-patterning portion of the sample is judged, will be described.

Further, a device and a computer program in which a boundary position between the repetition portion and a not-repeated portion is detected and the detected boundary position is caused to correspond to each site in the multi-patterning will be described.

Further, a device and a computer program in which groups obtained by classifying positions of the line candidates or the edges on the basis of a predetermined gap are classified on the basis of a line feature quantity will be described.

Further, a device and a computer program in which the number of line candidates or edges in the repetition portion is compared to the assumed number of lines, and unevenness is judged from the line candidates or the edge, on the basis of a feature quantity between the line candidates or a feature quantity between the edges will be described.

According to the above-described configuration, it is possible to easily realize judgement of unevenness on a sample, which is generated by the multi-patterning, and distinguishment between sites.

A method and a device in which incidence of a charged particle beam to a substrate which is generally used, in a vertical direction is not changed, but a profile for the intensity of the charged particles is obtained on the basis of detection of charged particles emitted from the scanning location, and unevenness is judged on the basis of the profile or sites are distinguished without an optical or mechanical operation of an inclination of the incident charged particles or an inclination of a holding stage of the substrate, will be described below with reference to the drawings.

According to the example, it is easy to judge unevenness or distinguish sites in a charged particle beam, and it is easy to judge an unevenness state of patterns, in which the same patterns like patterns of a line and space are continuous, and to distinguish sites thereof.

Since an optical or mechanical operation of an inclination of incident charged particles or an inclination of a holding stage of the substrate is not required, there is hardly an influence on throughput, particularly, and it is also effective in a production process which focuses on throughput and is automatized.

The vertical direction which will be described in the example is set to indicate a direction which is the same as an irradiation direction for charged particles without receiving deflection in a charged particle optical system, or to indicate a direction perpendicular to a moving direction of a sample stage which causes a sample to be moved in an X-Y direction. The charged particle beam device is a device that performs scanning with a charged particle beam in one dimension or two dimensions. A deflection state at this time is set not to be included in inclined irradiation which will be described in the example. That is, in the example, a scan deflector one-dimensionally or two-dimensionally performs scanning with a charged particle beam with which irradiation is performed through an optical axis of the charged particle beam (charged particle beam track to which deflection by a deflector is not applied). In other words, irradiation with the charged particle beam is performed in a state where deflection by another deflector is not applied (in a vertically-incident state).

FIG. 1 illustrates one configuration example of a scanning electron microscope system. In the following descriptions, descriptions will be made by using the scanning electron microscope as an example. However, it is not limited thereto, and the descriptions may be also applied to another charged particle beam device such as a focused ion beam device. The reference sign of 101 indicates a casing portion of an electron microscope. Electron beams 103 emitted from an electron gun 102 are condensed by an electron lens (not illustrated in FIG. 1), and a sample 105 is irradiated with the condensed electron beams. Irradiation with the electron beams causes an electron detector 106 to detect intensity of secondary electrons generated from a sample surface or intensity of reflection electrons, and causes an amplifier 107 to amplify the detected intensity. The reference sign of 104 indicates a deflector which moves a position of an electron beam. The deflector performs raster scanning on the sample surface with the electron beam 103, based on a control signal 108 of a control computer 110.

A signal output from the amplifier 107 is subjected to AD conversion in an image processing processor 109, so as to create digital image data. The reference sign of 111 indicates a display device that displays the image data. The image processing processor 109 includes an image memory for storing digital image data, an image processing circuit for performing various types of image processing, and a display control circuit for performing display control. Input means 112 such as a keyboard and a mouse is connected to the control computer 110.

The abovementioned image processing processor 109 or the abovementioned control computer 110 functions as an edge detection unit for edge position extraction which will be described later.

An address signal corresponding to a memory position of the image memory is generated in the control computer 110. The generated address signal is subjected to analog conversion, and then is supplied to the deflector 104 through a scan coil control power supply (not illustrated). For example, in a case where the image memory is for 512×512 pixels, an address signal in an X direction is a digital signal in which a value of 0 to 511 is repeated. An address signal in a Y direction is a digital signal in which a value of 0 to 511 to which 1 is added when the address signal in the X direction has a value from 0 to 511 is repeated. The supplied signal is converted into an analog signal.

Since an address of the image memory corresponds to an address of the deflection signal for scanning with an electron beam, a two-dimensional image of a deflection region of an electron beam by the deflector 104 is recorded in the image memory. Signals in the image memory can be sequentially read in time series, by a reading address generation circuit (not illustrated) which is synchronized with a reading clock. A signal read corresponding to an address is subjected to analog conversion, and is used as a luminance modulation signal of the display device 111.

The image memory has a function of superimposing (composing) and storing an image (image data) for improving an S/N ratio. For example, images obtained by performing two-dimensional scanning eight times are superimposed and stored, and thus one finished image is formed. That is, images which are formed one or more times in a unit of X-Y scanning are composed and thus finally an image is formed. The number of images for forming one finished image (the number of integrated frames) may be arbitrarily set. Considering conditions such as a secondary electron generation efficiency, an appropriate value is set. An image obtained by integrating a plurality of images, and a plurality of such images is superimposed, and thus it is possible to form an image which is desired to be finally obtained. When images of the desired number are stored or after that, blanking of the primary electron beam may be executed and an input of information to the image memory may be suspended.

The sample 105 is disposed on a stage (not illustrated). The sample 105 may be moved in two directions (X direction and Y direction) in a plane perpendicular to the electron beam.

The device in the example includes a function of forming a line profile on the basis of the detected secondary electron, the detected reflection electron, or the like. The line profile is formed on the basis of the quantity of detected electron, luminance information or the like of a sample image when one-dimensional scanning or two-dimensional scanning is performed with the primary electron beam. The obtained line profile is used, for example, in measurement of dimensions of a pattern formed on a semiconductor wafer.

The descriptions of FIG. 1 are used for a case where the control computer is integrated with the scanning electron microscope or a case equivalent to the case. However, it is not limited thereto. Processing as will be described below may be used by a control processor which is provided so as to be separate from the body of the scanning electron microscope. At this time, a transmission medium for transmitting a detection signal detected by the electron detector 106 to the control processor, or transmitting a signal from the control processor to a lens of the scanning electron microscope, the deflector, or the like, and an input and output terminal for inputting and outputting a signal transmitted through the transmission medium are required.

FIG. 25 illustrates an example of a pattern measurement system which includes a computation processing device 2503. As the system, a scanning electron microscope system which includes an SEM main body 2501, a control device 2502 of the SEM main body, and a computation processing device 2503 is included. In the computation processing device 2503, a computation processing unit 2504 and a memory 2505 are mounted. The computation processing unit 2504 supplies a predetermined control signal to the control device 2502 and executes signal processing on a signal obtained by the SEM main body 2501. The memory 2505 stores image information which has been obtained, or recipe information. In the example, a case where the control device 2502 and the computation processing device 2503 are provided so as to be separate from each other is described. However, an integral type control device may be applied.

Beam scanning by the deflector causes electrons emitted from the sample or electrons generated in a conversion electrode to be captured by a detector 2506, and to be converted into a digital signal by an A/D converter which is mounted in the control device 2502. Image processing in accordance with the purpose is performed by image processing hardware such as CPU, ASIC, and FPGA, which is mounted in the computation processing device 2503.

In the computation processing unit 2504, a profile creation portion 2507, a differential processing performing portion 2508, a threshold determination portion 2509, a grouping execution portion 2510, a similarity determination portion 2511, an edge/pattern identification portion 2512, and a measurement processing execution portion 2513 are mounted. The profile creation portion 2507 creates a waveform profile on the basis of a signal detected by the detector 2506. The differential processing performing portion 2508 performs differentiation or quadratic differentiation on the waveform profile created by the profile creation portion 2507. The threshold determination portion 2509 detects a feature of a waveform on the basis of setting of a predetermined threshold value. The grouping execution portion 2510 performs grouping of features exhibited from each position of the waveform profile on the basis of predetermined determination criteria. The similarity determination portion 2511 evaluates similarity between a portion of the waveform profile and other portions of the waveform profile. The edge/pattern identification portion 2512 identifies an edge or a pattern desired to be identified. The measurement processing execution portion 2513 executes measurement by using an edge which has been identified by the edge/pattern identification portion 2512, as a measurement starting point or a measurement ending point, or executes measurement between edges of the identified pattern.

The computation processing device 2503 executes identification or measurement of an edge or a pattern, on the basis of measurement condition and the like input by an input device 2515. A design data extraction portion 2516 is mounted in the computation processing unit 2504. The design data extraction portion 2516 reads design data from a design data storage medium 2514 in accordance with conditions input by the input device 2515, and if necessary, converts vector data into layout data. In the design data extraction portion 2516, information required for measurement, which will be described later is extracted from the design data.

A display device is provided in the input device 2515 which is connected to the computation processing device 2503 through a network. A GUI for displaying an image, an examination result, and the like for an operator are displayed in the display device.

Processing-control may be also performed by assigning a portion or the entirety of the control or the processing in the computation processing device 2503 to an electronic computer and the like in which a CPU and a memory enabling accumulation of images are mounted. The input device 2515 also functions as an image recipe creation device that sets a coordinate of an electronic device required for measurement, examination, or the like, the type of a pattern, and measurement conditions includes a capturing condition (optical condition or a moving condition of a stage), as an image recipe. The input device 2515 also includes a function of inquiring the input coordinate information or information pertaining to the pattern type, as layer information of the design data or distinguishment information of a pattern, and of reading necessary information from the design data storage medium 2514.

The design data stored in the design data storage medium 2514 is expressed in a GDS format, an OASIS format, or the like, and is stored in a predetermined form. If software for displaying design data may display the format type of the design data and may handle the design data as figure data, the design data may have any type. The figure data is replaced with line image information indicating an ideal shape of a pattern formed on the basis of the design data, and an exposure simulation is conducted on the line image information, and thus line image information which is subjected to modification processing so as to cause a pattern to be approximate to the actual pattern may be used.

A program for performing processing which will be described below may be registered in a storage medium, and a control processor that supplies a signal required for the scanning electron microscope which includes the image memory may execute the registered program.

EXAMPLE 1

FIG. 2 illustrates an example of lines generated in double patterning. The reference sign of 201 indicates an SEM image. The reference sign of 202 indicates a profile of a line pattern. For example, control in a process such as slimming or deposition in SADP is insufficient, and thus deviation may be occur at a portion in which lines are originally generated at an equal interval.

In the example, a method in which even when identification of a difference of a feature quantity between patterns having different types becomes difficult due to process conditions or increased fineness of patterns, patterns can be appropriately and stably distinguished from each other will be described.

FIG. 3 is a flowchart illustrating a process of multi-patterning portion judgement processing. Firstly, the profile creation portion 2507 generates a profile required for judging unevenness of lines in profile generation processing (Step 301). With this processing, a smoothed profile, a primary differentiation profile, and a quadratic differential profile are generated. FIG. 4 illustrates an outline of the profile generation processing. Firstly, in the projection processing (Step 401), as illustrated in FIG. 5, a pixel value of an image is projected onto an axis (here, an i axis) which is perpendicular to lines of the image, and additional averaging is performed in a line direction of the lines. Thus, improvement of S/N is achieved. If an image size is set to (M, N), the projection processing may be represented by Expression 1. Here, I(i, j) corresponds to a pixel value on image coordinates (i, j).

$$z(i) = \sum_{j=0}^{N} I(i,j)/N \quad \text{[Expression 1]}$$

Then, in smoothing processing (Step 402), the profile creation portion 2507 performs smoothing by using a moving average as indicated in Expression 2, and thus a smoothed profile for achieving improvement of S/N is obtained.

$$s(i) = \frac{1}{L} \sum_{k=-\frac{L-1}{2}}^{\frac{L-1}{2}} z(i+k) \quad \text{[Expression 2]}$$

Further, in differentiation processing (Step 403), the differential processing performing portion 2508 calculates a change of a signal, and thus obtains the primary differentiation profile.

$$d(i) = s\left(i + \frac{D-1}{2}\right) - s\left(i - \frac{D-1}{2}\right) \quad \text{[Expression 3]}$$

The differentiation processing (Step 404) is performed again on the primary differentiation profile which has been obtained in the differentiation processing (Step 403), thereby the quadratic differential profile is obtained.

FIG. 6 illustrates an example of each of the profiles generated by the profile generation processing. The reference sign of 601 indicates a smoothed profile. The reference sign of 602 indicates a primary differentiation profile, and the reference sign of 603 indicates a quadratic differential profile. In line candidates-space candidate extraction processing (Step 302), the threshold determination portion 2509 extracts a convex portion (line portion) and a concave portion (space portion) from the profile.

In the quadratic differential profile, in a form configured by a threshold value of 0 and the quadratic differential profile, a portion at which the value is lower than 0 is set as a line candidate and a portion at which the value is upper than 0 is set as a space candidate.

FIG. 7 illustrates a result of line candidates and space candidate extracted from the quadratic differential profile in FIG. 6, by the line candidate·space candidate extraction processing.

Since the quadratic differential profile is significantly sensitive to the minute change, as illustrated in FIG. 8, line candidates which result from noise and have a noise level may be extracted from the space portion or the top portion of lines.

Thus, in noise line candidate removal processing (Step 303), line candidates having a noise level lower than a noise level threshold are removed. Here, the noise level threshold may be directly applied by a user or may be calculated from peak values of the line candidates. For example, when the line candidates are arranged in order from having a large peak value, considering that a noise or a line other than a target is included, an average value of peak values of line candidates except for line candidates of the high rank X % and line candidates of the low rank Y % is set to 100%, the noise level threshold may be set a value of Z % of the average value.

In grouping processing (Step 304) in accordance with the line position, the line candidates are classified on the basis of coordinate positions of the line candidates and Design Pitch information. Lines generated by multi-patterning such as SADP, SAQP (self aligned quadruple patterning), and SAOP (self aligned octuple patterning) have intervals of Design Pitch, which are substantially equivalent to each other. Design Pitch means an ideal interval between specific patterns on design data. For example, in a case of SADP, Design Pitch corresponds to interval information between patterns 901 formed in an identification layer illustrated in FIG. 9. The information may be read from a design data storage medium, for example.

FIG. 9 illustrates a manufacturing process of the SADP. FIG. 9(*a*) illustrates an ideal case and FIG. 9(*b*) illustrates an example of a case where slimming is excessively performed in a manufacturing process of a semiconductor. In FIG. 9(*b*), the width of patterns 902 is narrower than that in the example of FIG. 9(*a*), as illustrated in the bottom of FIG. 9, dimensions between the patterns vary. It is understood that an interval between a line and an adjacent line is different for each line, but the intervals of Design Pitch (intervals between the patterns 901, intervals between the patterns 902) are the same as each other in FIGS. 9(*a*) and 9(*b*).

Grouping is performed by using the Design Pitch information. Here, the Design Pitch information may be directly input by a user or may be acquired from the design data. Self correlation is performed on the smoothed profile obtained in Step 301, and an interval between peaks which are approximate to the designated Design Pitch is obtained. Thus, it is possible to obtain the Design Pitch with high accuracy.

A grouping execution portion 2510 divides coordinate positions of line candidates by the Design Pitch and plots the remainders. Here, the center point of the right and left zero-cross points of each of the line candidates is used as an image coordinate position of each of the line candidates. However, the centroidal point of each of the line candidates may be used.

FIG. 10 illustrates an example in which image coordinate positions of line candidates in the SADP are divided by Design Pitch and the remainders are plotted. A horizontal axis indicates the image coordinate position, and a vertical axis indicates histogram. As understood through the figure of FIG. 10, recognition of regularity from the image coordinate positions of the line candidates is difficult. However, it is understood that division by the Design Pitch is performed and the remainders are plotted, and thus most of the line candidates in the SADP are gathered at the same position. More specifically, for example, coordinate positions (distances from positions having an X coordinate of zero) of peak positions (image coordinates) $G1_1$, $G1_2$, $G1_3$, and $G1_4$ which are obtained from the waveform profile in the X direction are different from each other. However, if division using Design Pitch 2401 as a denominator is performed, as illustrated in FIG. 24, a division result and the remainder 2402 in accordance with the position are output. If the remainder is plotted in the horizontal axis, it is possible to obtain the frequency of edges having the same type. In a case of the example, four output results having the same remainder 2402 are obtained. Such computation is performed on each edge, and thus the histogram as illustrated in FIG. 10 is created.

The grouping execution portion 2510 performs grouping on the basis of the histogram. As a method of the grouping, for example, the K-Means method and the like may be used.

As described above, the occurrence frequency of edges in accordance with a coordinate position in an image is obtained, and thus an edge having coordinate information of high occurrence frequency may be identified. More specifically, in the case of the example, G1 indicates an edge (right) on a spacer gap side, G2 indicates an edge (left) on a core gap side. G3 indicates an edge (right) on the core gap side and G4 indicates an edge (left) on the spacer gap side. Firstly, the appearance frequency is evaluated, and thus a probability of erroneous judgement due to mixture of the noise may be suppressed and identification of an edge belonging to a line pattern which is a measurement target may be performed. At this stage, distinguishment of an edge of a line pattern which is set as a measurement target is not possible. In a case where an edge of a line pattern which is set as the measurement target is distinguished, when four frequencies or the frequency of pattern edges which is set as the measurement target is equal to or more than a predetermined value, it is considered that the type of an edge is identified on the basis of position of the four frequencies or position information of each of the frequency. The minimum image coordinate of image coordinates of edges belonging to each of G1, G2, G3, and G4 is set as a representative value of the corresponding group. Among the representative values of the G1, G2, G3, and G4 groups, the first small value is set to indicate the edge (right) on the spacer gap, the second small value is set to indicate the edge (left) on the core gap. The third small value is set to indicate the edge (right) on the core gap side and the fourth small value is set to indicate the edge (left) on the spacer gap. Thus, it is recognized that G1 corresponds to the edge (right) on the spacer gap, G2 corresponds to the edge (left) on the core gap, G3 corresponds to the edge (right) on the core gap side, and G4 corresponds to the edge (left) on the spacer gap.

Relationship information stores a relationship between an edge position (occurrence order of edges) stored in the memory 2505, and the type of an edge or a pattern. The edge/pattern identification portion 2511 causes the relationship information to refer to information of a positions or an order of the edges, and thus a pattern edge or a pattern type is identified. The measurement processing execution portion 2513 measures the width of a pattern, a pitch between patterns, or the like by setting an identified and desired measurement target edge as a measurement starting point and/or a measurement ending point.

In a case where the core gap is identified, a region interposed between G2 and G3 is to be identified. Among frequencies which are equal to or more than a predetermined value in the histogram illustrated in FIG. 10, the second small frequency and the third small frequency are selected, and a portion positioned between edges indicating the selected frequencies is identified. In a case where the measurement target is a pitch between edges (right) on the spacer gap, plural pieces of G1 in a visual field are identified and dimensions between the identified G1 are measured. Then, the average of the measured G1 is obtained.

In the example, patterns or edges are required to be distinguished with higher accuracy, and the processes subsequent to Step 305 in FIG. 3 are executed. In the grouping processing (Step 305) in accordance with the line feature quantity, grouping is performed on groups obtained by performing grouping (classify) in Step 304, by using the line feature quantity. This is for distinguishing lines in multi-patterning, which are originally to be group, from lines which are accidentally classified into the same group.

Here, as the line feature quantity, similarity when profile matching is performed on the quadratic differential profile of each of line candidates is used.

The similarity is obtained by the similarity determination portion 2511. As illustrated in FIG. 11, when an area of a profile for Line 1 is set as S1 and an area of a profile for Line 2 is set as S2, the similarity may be indicated by Expression 4.

$$Eval = \frac{2 \times S1 \cap S2}{S1 + S2} \quad \text{[Expression 4]}$$

In the example, the similarity is calculated by using the quadratic differential profile. However, the smoothed profile or the primary differentiation profile may be used.

Here, if the similarity is equal to or more than a predetermined threshold value Eval_Th, Line 1 and Line 2 are grouped so as to be in the same group. In a case where the similarity is less than Eval_Th, Line 1 and Line 2 are grouped so as to be respectively in different groups.

Grouping into one or a plurality of groups is performed by using the similarity, such that the similarity of any two line candidates in the same group is equal to or more than Eval_Th.

An example of a grouping algorithm will be described below. However, grouping may be used by other methods, as long as the abovementioned conditions are satisfied.

1. Similarity for all pairs of lines which are grouping targets is obtained. In a case where a pair which has the maximum similarity in a range of being equal to or more than Eval_Th is set as an initial group (Group 1). In a case where there is no pair having similarity which is equal to or more than Eval_Th, all lines are grouped into groups which are different from each other, and the process is ended.

2. Among lines having similarities with all of the lines in Group 1, which are equal to more than Line Similarity, a line in which the sum of similarities is largest is added to Group 1.

3. The process of 2 is repeated until there is no line to be added.

4. Group 1 is excluded from a grouping target. The process is ended if there is no line as a grouping target. If a line as a grouping target is present, the process returns to the process of 1.

In repetition portion detection processing (Step 306), IDs are respectively added to line candidates of each group obtained by grouping in Step 304 and Step 305. The line candidates are aligned again on an image coordinate system.

FIG. 12 illustrates an example in which IDs are added to the samples in FIG. 10. If attention for a line portion by the SADP is attracted, it is understood that a pattern referring to 0, 1, 2, and 3 is repeated. Here, a repetition pattern is detected. Further, the repetition portion is detected by detecting a starting point of the repetition pattern and an ending point thereof. Thus, a multi-patterning portion is determined. Such a repetition state is detected, and thus a multi-patterning region may be distinguished from other regions.

In the pseudo space judgement processing (Step 307), the edge/pattern identification portion 2512 performs judgement of a line space on the multi-patterning portion determined in the repetition portion detection processing (Step 306) considering a difference by a shape of a line.

FIG. 13 is a sectional view of a line pattern and illustrates a profile of the line pattern. In a case where the width of a line is sufficiently large like 1301, since a peak is generated at a boundary between a line and a space like 1303 and 1305, two line candidates (peaks) are considered as one line. However, if the width of a line becomes narrow like 1302, the right peak and the left peak are considered as one peak like 1304 and 1306, and one line candidate (peak) is considered as one line.

Firstly, it is judged that a line of the multi-patterning portion is a line obtained by considering two line candidates as one line or a line obtained by considering one line candidate as one line.

As indicated by Expression 5, an estimated number of lines may be obtained from the repetition portion by using Design Pitch and Patterning, and the obtained number may be compared to the actual number of line candidates. The number of components of the repetition pattern may be compared to Patterning.

$$\text{Estimated number of lines} = (\text{repetition portion/Design Pitch}) \times \text{Patterning} \quad \text{[Expression 5]}$$

Here, Patterning indicates the number of lines included in Design Pitch (the number of performed exposure). In a case of double patterning, Patterning is set to 2. In a case of triple patterning, Patterning is set to 3. In a case of quadruple patterning, Patterning is set to 4. Patterning may be directly input by a user or may be acquired from design data and the like.

FIG. 14 illustrates an example. Since the number of line candidates is a numeric value 16 times 8 which is the estimated number of lines, it is understood that two line candidates are considered as one line.

Regarding that the number of components of the repetition pattern is 4, judgement may be performed similarly by using a fact that Patterning is 2.

In a case where one line candidate corresponds to one line, since judgement of a line space is not required, the process is ended here.

In a case where one line is formed by two line candidates, judgement of which pair of line candidates forms a line is required.

Firstly, grouping is performed for each space between line IDs. FIG. 15 illustrates an example in which pseudo space judgement is performed on the repetition portion in FIG. 14. Since the repetition portion is repeated in an order of 0, 1, 2, and 3, space candidates may be grouped into the following four groups.

Space 1: between 0 and 1
Space 2: between 1 and 2
Space 3: between 2 and 3
Space 4: between 3 and 0

Feature quantities are calculated in order to judge spaces in each of groups from Space 1 to Space 4. The average of the calculated feature quantities is set as a space evaluation value of the group.

As the feature quantity, for example, an area of a space candidate in the quadratic differential profile as illustrated in FIG. 15, the height between peaks of portions corresponding to space candidates in the primary differentiation profile as illustrated in FIG. 16, and the like are used.

Groups corresponding to the number of Patterning are judged to be pseudo spaces from the calculated evaluation values of the groups in an order from being small.

It is understood that Space 1 and Space 3 are set as the pseudo space, from the examples in FIGS. 15 and 16.

Using a point that the pseudo space and a space are necessarily and alternately disposed, Space 1 and Space 3 may be grouped into one group Space 1', and Space 2 and Space 4 may be grouped into one group Space 2'. Then, the pseudo space may be judged from evaluation values of the groups. The pseudo space is merged with two line candidates between which a space candidate belonging to the judged group is interposed, so as to form one line candidate. Thus, as illustrated in FIG. 17, it is possible to judge the unevenness of lines at the multi-patterning portion.

In the line structure association processing (Step 308), a boundary position between the repetition pattern and a not-repeated portion is detected, and each site having a line structure in multi-patterning is associated with the detected boundary position. FIG. 18 illustrates an example of double patterning. The line structure in the double patterning is generally classified into a line portion (Left Line, Right Line) and a space portion (Core Gap, Spacer Gap). In a case where a boundary is provided on the left side, association is sequentially performed from a line at the left end of the repetition portion, in an order of Left Line, Core Gap, Right Line, and Spacer Gap. In a case where the boundary is provided on the one right side, association is sequentially performed from a line at the right end of the repetition portion, in an order of Right Line, Core Gap, Left Line, and Spacer Gap. In the example of FIG. 18, since boundary positions are provided on both sides, that is, the right and left sides of the repetition portion, association may be performed from either of the both sides thereof.

In the example, an example of double patterning is described. However, regarding patterns of quadruple patterning or octuple patterning, similarly, judgement of unevenness of lines and association of the line structure can be performed as long as appropriate information regarding Design Pitch and Patterning can be obtained.

In the example, the descriptions are made by using multi-patterning as the premise. However, an interval between adjacent lines is designated to Design Pitch and 1 is designated to Patterning, and thus the example may also correspond to single patterning.

FIG. 26 is a diagram illustrating an example of a GUI screen for setting a measurement condition of the scanning electron microscope. Such a GUI screen is displayed in the display device of the input device 2515, for example. A process setting window 2601 is provided for a manufacturing process of a pattern which is set as the measurement target. A layer setting window 2602 are provided for inputting layer information. A coordinate input window 2603 is provided for inputting a position of a visual field (Field Of View: FOV) of the scanning electron microscope. A visual-field size setting input window 2604 is provided for inputting the size of a scanning range of the scanning electron microscope. Setting in the windows allows information of patterns included in the scanning range of a beam to the patterns which are set as the measurement target, to be identified. Thus, the computation processing device 2503 reads pattern information included in the visual field, from the design data storage medium 2514 on the basis of setting these pieces of information.

A pattern information setting window 2605 is provided for setting the type of a pattern which is set as the measurement target. A measurement target selecting window 2606 is provided for selecting a measurement target pattern (or an edge of a pattern which is set as the measurement target). In order to measure the measurement target pattern selected herein, the target pattern or edge is identified by using the above-described algorithm.

According to setting of the measurement condition by using such a GUI screen, it is possible to measure a pattern on the basis of appropriate pattern identification, only by selecting information pertaining to a measurement target pattern.

EXAMPLE 2

In Example 1, a profile is generated from an SEM image and line candidates are extracted. A line and a space are obtained in a state where a multi-patterning portion is judged. The above-described algorithm is applied to a line detected by using any known method, and thus it is possible to judge the multi-patterning portion.

FIG. 19 illustrates an outline of multi-patterning portion judgement processing. In line position calculation processing (Step 1901), a line position of a line detected by using any method is calculated. In a case where the line position is previously obtained, the value of the line position may be used. For example, a central position between the right and left edge positions may be used as the line position. As described in Example 1, an intermediate point between the right and left zero-cross points of a line candidate corresponding to a line may be used as the line position or a centroidal position of the line candidate may be used as the line position.

The grouping processing in accordance with the line position (Step 304) is the same process as that in Example 1. Design Pitch information may be directly input by a user or may be acquired from design data. Self correlation is performed on the smoothed profile obtained in Step 301, and an interval between peaks which are approximate to the designated Design Pitch is obtained. Thus, it is possible to obtain the Design Pitch with high accuracy.

The grouping processing in accordance with the line position (Step 304) is performed by using an example of the line pattern in FIG. 10. FIG. 20 illustrates a result obtained by performing the grouping processing. Since line candidates are used in Example 1, a result in FIG. 20 is different from a result in Example 1. Since the interval between line positions is approximate to Design Pitch, L8 and L10 are classified into the same group at this time.

The grouping processing in accordance with the line feature quantity (Step 305) is the same process as that in Example 1. The grouping processing in accordance with the line feature quantity (Step 305) is performed on the result in FIG. 20. FIG. 21 illustrates a result obtained by performing the grouping processing (Step 305). Here, since L10 has a feature quantity different from a line in another Group 2, L10 is classified into another group.

The repetition portion detection processing (Step 306) is the same process as that in Example 1. The repetition portion detection processing (Step 305) is performed on the result in FIG. 21. FIG. 22 illustrates a result obtained by performing the repetition portion detection processing (Step 305). Here, it is understood that a region from L2 to L9 corresponds to the repetition portion and corresponds to the multi-patterning portion.

Here, the number of lines at the multi-patterning portion is compared to the estimated number of lines, which is calculated from Expression 4, in order to determine whether the number of lines at the multi-patterning portion is the same as the estimated number of lines. Thus, it is also possible to check validity.

The line structure association processing (Step 308) is the same process as that in Example 1. The line structure association processing (Step 308) is performed on the result in FIG. 22. FIG. 23 illustrates a result obtained by performing the line structure association processing (Step 308). Association is performed in an order of Left Line, Core Gap, Right Line, and Spacer Gap from the left side.

REFERENCE SIGNS LIST

101 CASING PORTION OF ELECTRON MICROSCOPE
102 ELECTRON GUN
103 ELECTRON BEAM
104 DEFLECTOR
105 SAMPLE
106 ELECTRON DETECTOR
107 AMPLIFIER
108 CONTROL SIGNAL
109 IMAGE PROCESSING PROCESSOR
109 IMAGE PROCESSING PROCESSOR
110 CONTROL COMPUTER
111 DISPLAY DEVICE
112 INPUT MEANS
201 SEM IMAGE
202 PROFILE OF LINE PATTERN
301 PROFILE GENERATION PROCESSING
302 LINE CANDIDATES-SPACE CANDIDATE EXTRACTION PROCESSING
303 NOISE LINE CANDIDATE REMOVAL PROCESSING
304 GROUPING PROCESSING IN ACCORDANCE WITH LINE POSITION
305 GROUPING PROCESSING IN ACCORDANCE WITH LINE FEATURE QUANTITY
306 REPETITION PORTION DETECTION PROCESSING
307 PSEUDO SPACE JUDGEMENT PROCESSING
308 LINE STRUCTURE ASSOCIATION PROCESSING
401 PROJECTION PROCESSING
402 SMOOTHING PROCESSING
403 DIFFERENTIAL OPERATION
404 DIFFERENTIAL OPERATION
601 SMOOTHED PROFILE
602 PRIMARY DIFFERENTIATION PROFILE
603 QUADRATIC DIFFERENTIAL PROFILE
1301 SECTIONAL VIEW OF LINE PATTERN (IN A CASE WHERE THE WIDTH OF LINE IS WIDE)
1302 SECTIONAL VIEW OF LINE PATTERN (IN A CASE WHERE THE WIDTH OF LINE IS NARROW)
1303 SMOOTHED PROFILE OF LINE PATTERN OF 1301
1304 SMOOTHED PROFILE OF LINE PATTERN OF 1302
1305 QUADRATIC DIFFERENTIAL PROFILE OF LINE PATTERN OF 1301
1306 QUADRATIC DIFFERENTIAL PROFILE OF LINE PATTERN OF 1302
1901 LINE POSITION CALCULATION PROCESSING

The invention claimed is:

1. A pattern measurement device comprising:
a computation device using a waveform signal obtained by scanning a pattern with a charged particle beam to measure a measurement target pattern,
wherein
the computation device classifies pattern sites which are repeatedly arrayed at a specific interval, based on phase information on an array of an edge of the pattern having a specific period, on the basis of the waveform signal, and executes a pattern edge type identification, a pattern type identification, or measurement of dimensions between predetermined pattern sites, on the basis of association between the classified pattern site, and information pertaining to a pattern edge type, or information pertaining to a pattern type.

2. The pattern measurement device according to claim 1, wherein
the computation device divides coordinate values of the pattern sites by the specific period, so as to classify the pattern sites.

3. The pattern measurement device according to claim 1, wherein
the computation device classifies the pattern sites by grouping pattern sites having a same remainder which is obtained by dividing coordinate values of the pattern sites by the specific period.

4. The pattern measurement device according to claim 1, wherein
the computation device further classifies the classified pattern sites on the basis of features of the pattern sites in the waveform signal.

5. The pattern measurement device according to claim 1, wherein
the computation device distinguishes between a region in which patterns are repeatedly arrayed at the specific interval, and other regions.

6. The pattern measurement device according to claim 1, wherein
the computation device judges whether each pattern included in a region in which patterns are repeatedly arrayed at the specific interval has one peak or two peaks, by using the number of performed exposure for forming the patterns included in the region.

7. The pattern measurement device according to claim 6, wherein
the computation device judges a space included in the region, on the basis of judgement of whether each of the patterns has one peak or two peaks.

8. The pattern measurement device according to claim 1, wherein
the computation device detects a boundary position between a repetition portion and a not-repeated portion, and causes the detected portion to correspond to each site in multi-patterning.

9. The pattern measurement device according to claim 1, wherein
the computation device further classifies groups obtained by classifying positions of line candidates or edges on the basis of a predetermined gap, on the basis of a line feature quantity.

10. The pattern measurement device according to claim 9, wherein
a portion at which a portion corresponding to the line candidate or the edge overlaps two quadratic differential profiles is set as the line feature quantity.

11. The pattern measurement device according to claim 9, wherein
a portion at which a portion corresponding to the line candidate or the edge overlaps two smoothed profiles is set as the line feature quantity.

12. The pattern measurement device according to claim 1, wherein
the computation device compares the number of line candidates or edges in a repetition portion, to the assumed number of lines, and judges the pattern edge type or the pattern type based on a feature quantity between the line candidates or edges from the line candidates, or edges.

13. The pattern measurement device according to claim 12, wherein
an area of a quadratic differential profile of portions between the line candidates or portions between the edges is set as the feature quantity.

14. The pattern measurement device according to claim 12, wherein
the sum of heights of an upper side peak and a lower side peak in a primary differentiation of a portion between the line candidates or a portion between the edges is set as the feature quantity.

15. A non-transitory computer-readable medium storing a program causing a computer to use a waveform signal obtained by scanning the pattern with a charged particle beam to measure a measurement target pattern, wherein
the program causes the computer to classify pattern sites which are repeatedly arrayed at a specific interval, on the basis of the waveform signal based on phase information on an array of an edge of the pattern having a specific period, and to execute a pattern edge type identification, a pattern type identification, or measurement of dimensions between predetermined pattern sites, on the basis of association between the classified pattern site, and information pertaining to a pattern edge type, or information pertaining to a pattern type.

* * * * *